United States Patent
Suri et al.

(10) Patent No.: US 7,024,027 B1
(45) Date of Patent: Apr. 4, 2006

(54) METHOD AND APPARATUS FOR THREE-DIMENSIONAL FILTERING OF ANGIOGRAPHIC VOLUME DATA

(75) Inventors: Jasjit S. Suri, Highland Heights, OH (US); Kecheng Liu, Solon, OH (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 785 days.

(21) Appl. No.: 10/011,036

(22) Filed: Nov. 13, 2001

(51) Int. Cl.
*G06K 9/00* (2006.01)

(52) U.S. Cl. ............... 382/130; 382/154; 382/173; 382/274; 382/284; 600/410

(58) Field of Classification Search ............... 382/128, 382/130, 284, 286, 308, 131, 132, 154; 128/922; 600/310, 411, 410, 407
See application file for complete search history.

(56) References Cited

U.S. PATENT DOCUMENTS

| | | | |
|---|---|---|---|
| 5,570,404 A | 10/1996 | Liang et al. | 378/8 |
| 5,699,799 A | 12/1997 | Xu et al. | 128/653.1 |
| 5,751,395 A * | 5/1998 | Thall | 351/221 |
| 5,832,134 A | 11/1998 | Avinash et al. | 392/257 |
| 5,880,813 A * | 3/1999 | Thall | 351/221 |
| 6,058,218 A | 5/2000 | Cline | 382/254 |
| 6,073,042 A | 6/2000 | Simonetti | 600/420 |
| 6,373,250 B1* | 4/2002 | Tsoref et al. | 324/309 |
| 6,374,128 B1* | 4/2002 | Toida et al. | 600/310 |
| 6,535,757 B1* | 3/2003 | Ono | 600/476 |
| 6,813,373 B1* | 11/2004 | Suri et al. | 382/128 |
| 6,845,260 B1* | 1/2005 | Liu et al. | 600/410 |
| 6,847,737 B1* | 1/2005 | Kouri et al. | 382/260 |
| 6,937,776 B1* | 8/2005 | Li et al. | 382/260 |
| 2002/0008848 A1* | 1/2002 | Ono | 351/209 |
| 2002/0114499 A1* | 8/2002 | Breitenstein et al. | 382/128 |
| 2003/0166999 A1* | 9/2003 | Liu et al. | 600/410 |
| 2003/0195411 A1* | 10/2003 | Sureda et al. | 600/411 |
| 2004/0013291 A1* | 1/2004 | Hillman | 382/128 |
| 2004/0071363 A1* | 4/2004 | Kouri et al. | 382/276 |
| 2004/0151356 A1* | 8/2004 | Li et al. | 382/131 |
| 2004/0184647 A1* | 9/2004 | Reeves et al. | 382/131 |

(Continued)

FOREIGN PATENT DOCUMENTS

EP 542414 A1 5/1993

(Continued)

OTHER PUBLICATIONS

Krissian, et al., "Model-Based Multiscale Detection of 3D Vessels", Biomedical Image Analysis, 1998, Proceedings Workshop on Santa Barabar, CA Jun. 26-27, 1998, Los Alamitos, CA IEEE Comput. Soc. US pp 202-210.

(Continued)

*Primary Examiner*—Barry Choobin
(74) *Attorney, Agent, or Firm*—Fay, Sharpe, Fagan, Minnich & McKee

(57) ABSTRACT

A filtering method and apparatus for selectively filtering a gray scale angiographic image volume (54) that images vascular structures and that also contains extraneous non-vascular contrast is disclosed. A minimum vessel width parameter $W_{min}$ (70) is selected. A maximum vessel width parameter $W_{max}$ (132) is selected. A range of widths (66) are selected such that each vessel width parameter $W_i$ (194) lies between $W_{min}$ (70) and $W_{max}$ (132) inclusive. For each $W_i$ (194), an image $I_i(x,y,z)$ (198) is generated that selectively retains imaged vascular structures of diameter $W_i$ (194). The images $I_i(x,y,z)$ (198) are combined to form a filtered image $I_F(x,y,z)$ (64) that selectively images the vascular structures.

26 Claims, 17 Drawing Sheets

U.S. PATENT DOCUMENTS

2005/0137159 A1* 6/2005 Bab et al. .............. 514/44

FOREIGN PATENT DOCUMENTS

JP          03-147082      6/1991

OTHER PUBLICATIONS

Reuze, et al., "3-D Vessel Tracking and Quantitation in Angio MRI", Bioengineering Conference, 1993, Proc. of 1993 IEEE 19th Annual NE, Newark NJ Mar. 18-19, 1993, pp 43-44.

Database Inspec Online! Inst. of Electrical Engineers, Stevenage, GB Akashi, et al., "Computer-Aided Diagnosis of Mitral Valve Stenosis Based on Maximum Blood Vessel Diameter Ratio in Upper and Lower Lung Fields in Chest X-Ray Images", DB 7100443—XP002233789 & Med. Imaging Technology Sep. 2001, Jap. Soc. Med, Imaging Technol. JP, V. 19, No. 5, pp 400-403.

Stein, et al. "Tracing of Thin Tubular Structures in Computer Tomographic Data", Computer Aided Surgery 3:83-88 (1998).

Sato, et al., "Three-Dimensional Multi-Scale Line Filter For Segmentation and Visualization of Curvilinear Structures in Medical Images", Medical Image Analysis (1998) V. 2, N. 2 pp 143-168.

Anderson, et al., "Artifacts in Maximum-Intensity-Projection Display of MR Angiograms", AJR 154:623-629 Mar. 1990.

Suri, et al., "Shape Recovery Algorithms Using Level Sets in 2-D/3-D Medical Imagery: A State-of-the Art Review", IEEE Trans. On Information Technology in Biomedicine, V. 6, N. 1, Mar. 2002.

Suri, "2-D Fast MR Brain Segmentation", Int'l Journal of Engineering in Medicine & Biology (EMBS) v. 20, N. 4, pp. 84-95, Jul./Aug. 2001.

Suri, "White Matter/Gray Matter Boundary Segmentation Using Geometric Snakes: A Fuzzy Deformable Model", Singh, et al. (Eds.): ICAPR 2001, LNCS 2013, pp. 331-338, 2001.

Wust, et al., "Evaluation of Segmentation Algorithms For Generation of Patient Models in Radiofrequency Hyperthermia", Phys. Med. Biol. 43 (1998) 3295-3307.

* cited by examiner

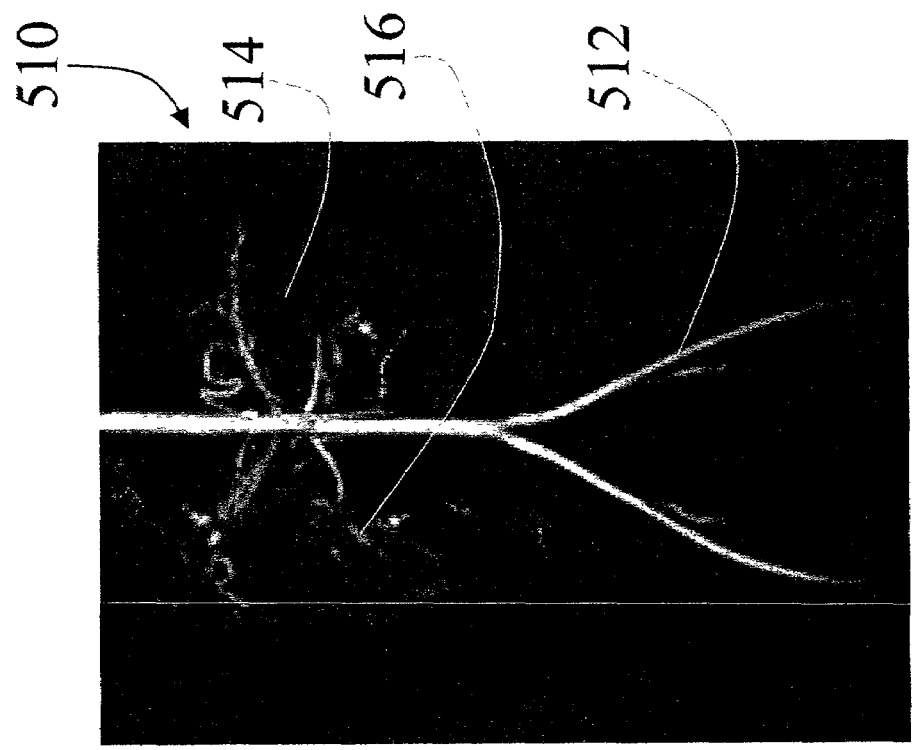
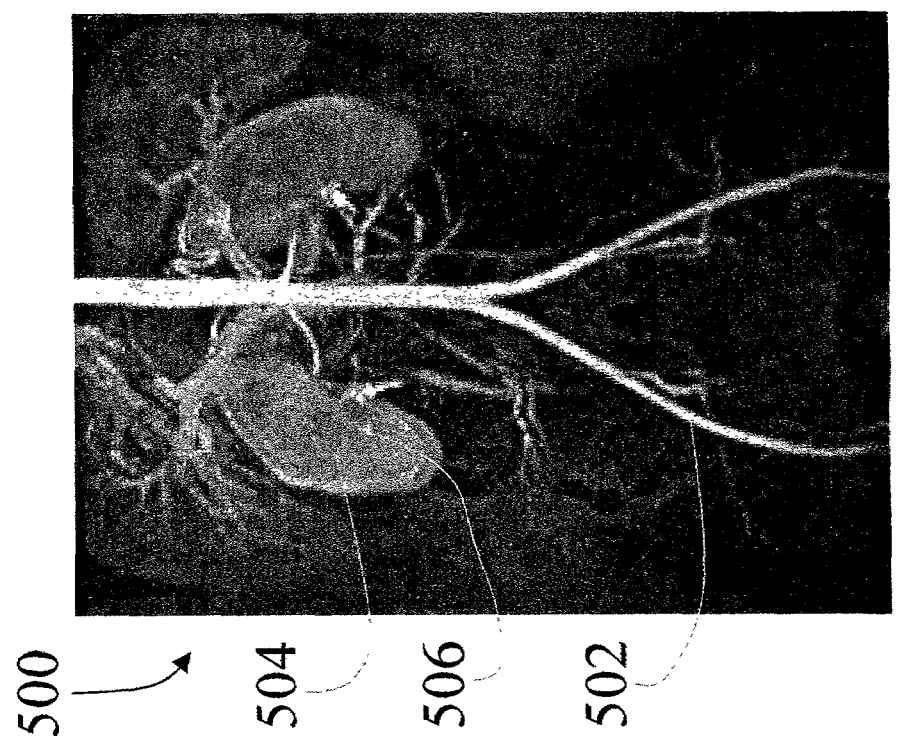
FIG 17B
FIG 17A

METHOD AND APPARATUS FOR THREE-DIMENSIONAL FILTERING OF ANGIOGRAPHIC VOLUME DATA

BACKGROUND OF THE INVENTION

The present invention relates to the medical imaging arts. It particularly relates to three-dimensional angiography using the magnetic resonance imaging (MRI) and computed tomography (CT) medical imaging techniques, and will be described with particular reference thereto. However, the invention will also find application in conjunction with other three-dimensional or two-dimensional angiographic imaging modalities as well as in other imaging arts in which tubular structures and networks of non-uniform diameter are advantageously differentiated from extraneous imaged structures and background noise.

Catastrophic medical events such as heart attacks and strokes that result from underlying vascular problems are a leading cause of death in the United States. Many Americans also suffer from chronic vascular diseases which degrade quality of life.

Angiography, which relates to the imaging of blood vessels and blood vessel systems, is a powerful medical diagnostic for identifying and tracking vascular diseases. Angiography enables improved surgical planning and treatment, improved diagnosis and convenient non-invasive monitoring of chronic vascular diseases, and can provide an early warning of potentially fatal conditions such as aneurysms and blood clots.

Angiography is performed using a number of different medical imaging modalities, including biplane X-ray/DSA, magnetic resonance (MR), computed tomography

BACKGROUND OF THE INVENTION

The present invention relates to the medical imaging arts. It particularly relates to three-dimensional angiography using the magnetic resonance imaging (MRI) and computed tomography (CT) medical imaging techniques, and will be described with particular reference thereto. However, the invention will also find application in conjunction with other three-dimensional or two-dimensional angiographic imaging modalities as well as in other imaging arts in which tubular structures and networks of non-uniform diameter are advantageously differentiated from extraneous imaged structures and background noise.

Catastrophic medical events such as heart attacks and strokes that result from underlying vascular problems are a leading cause of death in the United States. Many Americans also suffer from chronic vascular diseases which degrade quality of life.

Angiography, which relates to the imaging of blood vessels and blood vessel systems, is a powerful medical diagnostic for identifying and tracking vascular diseases. Angiography enables improved surgical planning and treatment, improved diagnosis and convenient non-invasive monitoring of chronic vascular diseases, and can provide an early warning of potentially fatal conditions such as aneurysms and blood clots.

Angiography is performed using a number of different medical imaging modalities, including biplane X-ray/DSA, magnetic resonance (MR), computed tomography (CT), ultrasound, and various combinations of these techniques. Two-dimensional or three-dimensional angiographic data can be acquired depending upon the medical imaging modality and the selected operating parameters. Many angiographic techniques employ invasive or contrast enhanced methodologies in which a contrast agent that accentuates the vascular image contrast is administered to the patient prior to the imaging session. For example, in MR imaging, a magnetic contrast agent such as Gadolinium-Dithylene-Triamine-Penta-Acetate can be administered. However, some techniques, such as MR imaging, are also capable of providing vascular contrast using non-invasive approaches, by taking advantage of aspects of the vascular system, particularly the blood motion or flow, to enhance the vascular contrast without an administered contrast agent. An example of such a methodology in MR imaging is the time of flight (TOF) technique in which the magnetic resonance excitation and the spin echo RF pulse are directed at different slices such that the magnetic resonance excitation of the flowing blood is selectively echoed.

Regardless of the imaging modality or technique, three-dimensional or volume angiographic imaging typically produces gray scale data comprised of voxels of varying intensity. Analysis and interpretation of the unprocessed gray scale angiographic image is complicated by a number of factors. Complexity arises because blood vessel networks in the human body are highly intricate, and a particular image will typically include tortuous or occluded blood vessels, shape variability, regions of very high blood vessel densities, a wide range of blood vessel diameters, and the like. Additionally, angiographic techniques, although designed to selectively image the vascular system, typically also include contrast due to non-vascular structures such as internal organs and bone tissue that can further obscure the imaging of the vascular system. The angiographic data acquisition itself also introduces imaging artifacts such as background noise and partial volume averaging.

The vascular contrast of the raw angiographic data is advantageously improved through post-acquisition data processing or filtering. However, past filtering methods have proven unsatisfactory for removing non-vascular structures due to the large variation in blood vessel diameters in typical angiographic data which makes distinguishing blood vessels from other body organs and bone tissue difficult. In the past, clinicians have resorted to manually removing identifiable non-vascular image portions. This approach is highly unsatisfactory because it is labor intensive and can result in the loss of valuable vascular information in the removed image regions.

The present invention contemplates an improved post-acquisition angiographic filtering system and method, which overcomes the aforementioned limitations and others.

SUMMARY OF THE INVENTION

According to one aspect of the invention, a post-acquisition method for filtering three-dimensional angiographic image data comprised of gray scale voxels is disclosed. A set of blood vessel width parameters $W_i$ that range from a minimum width parameter $W_{min}$ to a maximum width parameter $W_{max}$ are defined. For each width parameter $W_i$ a vessel score is calculated associated with each voxel. The vessel score is indicative of the likelihood that the voxel is included in a blood vessel of width corresponding to $W_1$. The angiographic image data are filtered based on the calculated vessel scores of each voxel.

According to another aspect of the invention, a method for estimating the largest blood vessel diameter contained within a gray scale angiographic image volume is disclosed. A MIP comprising one of a maximum intensity projection and a minimum intensity projection is obtained from the angiographic image volume. The MIP is binarized to generate a binary image representation using a binarization threshold that enhances vascular contrast. The largest blood vessel structure in the binary image representation is identified. The diameter of the largest blood vessel is estimated.

According to yet another aspect of the invention, an apparatus is disclosed for producing a filtered gray scale three-dimensional angiographic image representation of a subject. An imaging scanner acquires imaging data from at least a portion of a patient. A reconstruction processor reconstructs a three-dimensional image representation from the imaging data. The image representation includes vascular contrast effectuated by at least one of an associated contrast agent administered to the patient and an operative imaging modality of the imaging scanner that selectively images vascular structure. A post-acquisition processor transforms the image representation into a pre-processed image representation that conforms to a pre-selected image format. The post-acquisition processor generates a plurality of images $I_i(x,y,z)$ each of which selectively retains vascular structures of width $W_i$ contained in the pre-processed image, where the widths $W_i$ span a range from a minimum $W_{min}$ to a maximum $W_{max}$ inclusive. The post-acquisition processor combines the images $I_i(x,y,z)$ to form a filtered angiographic image representation that selectively retains vascular structures having widths between $W_{min}$ and $W_{max}$ inclusive.

According to still yet another aspect of the invention, an angiography method is disclosed. A three dimensional diagnostic image representation of anatomical structure including blood and non-vascular tissue is generated in a volume of interest. The diagnostic image representation is analyzed to identify tubular structures with a pre-selected cross-section in a first size range and creating a first tubular structure image representation of the identified structures in the first size range. The diagnostic image representation is analyzed to identify tubular structures with a pre-selected cross-section in a second size range and creating a second tubular structure image representation of the identified structures in the second size range. The first and second tubular structure image representations are combined to generate an angiographic image representation.

One advantage of the present invention is that it substantially removes confusing and obscuring non-vascular contrast from an angiographic image.

Another advantage of the present invention is that it accounts during the filtering for the range of vessel size scales which are typically present in angiographic data.

Yet another advantage of the present invention is that it provides rapid filtering using derivatives obtained by convolution with Gaussian derivatives in a separable computational mode.

Still further advantages and benefits of the present invention will become apparent to those of ordinary skill in the art upon reading the following detailed description of the preferred embodiment.

BRIEF DESCRIPTION OF THE DRAWINGS

The invention may take form in various components and arrangements of components, and in various steps and arrangements of steps. The drawings are only for the purpose of illustrating preferred embodiments and are not to be construed as limiting the invention.

FIG. 17A shows an unfiltered raw MIP image of a abdomen region; and

FIG. 17B shows the raw MIP image of FIG. 17A after filtering using an embodiment of the invention.

DETAILED DESCRIPTION OF THE PREFERRED EMBODIMENTS

Figure 1:
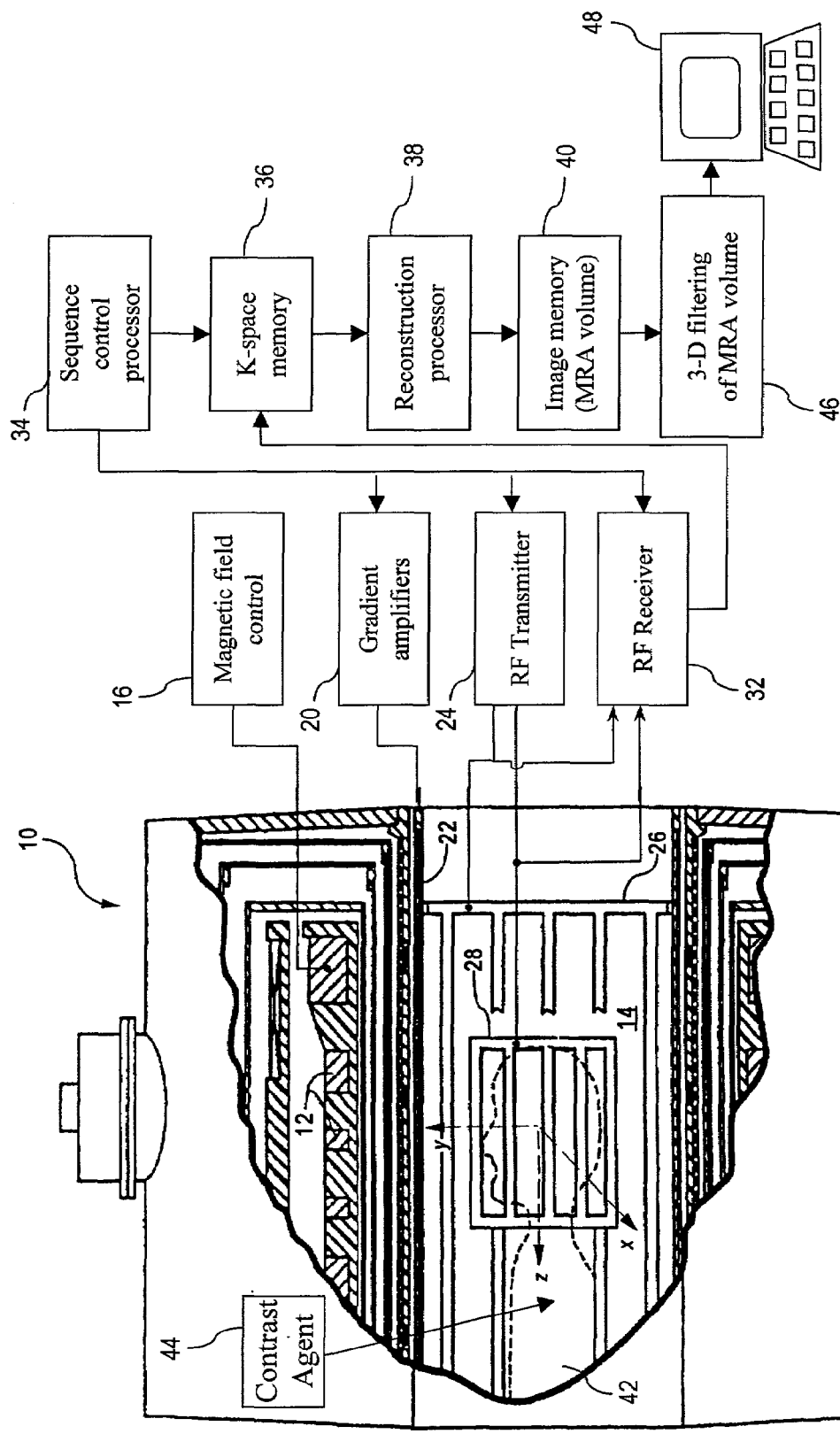
FIG. 1 shows an exemplary magnetic resonance angiography apparatus that suitably practices an embodiment of the invention.

With reference to FIG. 1, a magnetic resonance imaging system that suitably practices volumetric angiographic imaging in accordance with an embodiment of the invention is described. Although the invention is described herein with respect to a magnetic resonance imaging embodiment, those skilled in the art will appreciate that the invention is applicable to a broad range of three-dimensional angiographic modalities and techniques, including but not limited to contrast-enhanced magnetic resonance angiography, non-contrast enhanced magnetic angiography, and computed tomographic angiography.

With reference to FIG. 1, a magnetic resonance imaging (MRI) scanner 10 typically includes superconducting or resistive magnets 12 that create a substantially uniform, temporally constant main magnetic field $B_0$ along a z-axis through an examination region 14. Although a bore-type magnet is illustrated in FIG. 1, the present invention is equally applicable to open magnet systems and other known types of MRI scanners. The magnets 12 are operated by a main magnetic field control 16. Imaging is conducted by executing a magnetic resonance (MR) sequence with the subject being imaged, e.g. a patient 42 in a magnetic resonance angiography (MRA) session, placed at least partially within the examination region 14, typically with the region of interest at the isocenter.

The magnetic resonance sequence entails a series of RF and magnetic field gradient pulses that are applied to the subject to invert or excite magnetic spins, induce magnetic resonance, refocus magnetic resonance, manipulate magnetic resonance, spatially and otherwise encode the magnetic resonance, to saturate spins, and the like. More specifically, gradient pulse amplifiers 20 apply current pulses to a whole body gradient coil assembly 22 to create magnetic field gradients along x-, y-, and z-axes of the examination region 14.

An RF transmitter 24, preferably digital, applies RF pulses or pulse packets to a whole-body RF coil 26 to transmit RF pulses into the examination region. A typical RF pulse is composed of a packet of immediately contiguous pulse segments of short duration which taken together with each other and any applied gradients achieve a selected magnetic resonance manipulation. The RF pulses are used to saturate, excite resonance, invert magnetization, refocus resonance, or manipulate resonance in selected portions of the examination region.

For whole-body applications, the resulting resonance signals, generated as a result of a selected manipulation, are also picked up by the whole-body RF coil 26. Alternately, for generating RF pulses in limited regions of the subject, local RF coils are placed contiguous to the selected region. For example, as is known in the art, an insertable head coil 28 is inserted surrounding a selected brain region at the isocenter of the bore. Other surface coils or other such specialized RF coils may also be employed. For example, the RF system optionally includes a phased array receive coil (not shown) whereby partial parallel imaging (PPI) techniques known to the art are enabled. Preferably, the whole-body RF coil 26 induces resonance and the local RF coil or coil array receives magnetic resonance signals emanating from the selected region. In other embodiments, the local RF coil both excites and receives the resulting magnetic resonance signals.

Regardless of the RF coil configuration and the application thereof, the resultant RF magnetic resonance signals that are picked up by one or another of the RF coils is received and demodulated by an RF receiver 32. A sequence control processor 34 controls the gradient pulse amplifiers 20, the RF transmitter 24, and the RF receiver 32 to produce integrated MRI pulse sequence and readout waveforms that generate the magnetic resonance (MR) signals and optional echoes, provide appropriate encoding gradients to spatially encode the resultant MR response, and coordinate MR pickup and receive operations.

The MRI sequence typically includes a complex series of magnetic field gradient pulses and/or sweeps generated by the gradient amplifiers 20 which along with selected RF pulses generated by RF coils 26, 28 result in magnetic resonance echoes that map into k-space. The resultant magnetic resonance data is stored in a k-space memory 36. The k-space data is processed by a reconstruction processor 38, which is typically an inverse Fourier transform processor or other reconstruction processor known to the art, to produce a reconstructed image representation that is stored in an image memory 40.

In magnetic resonance angiography (MRA), a patient 42 is imaged by the MRI system 10 using imaging conditions that particularly emphasize the vascular system in the resultant image. In the exemplary FIG. 1, the carotid area of the patient 42 is imaged. Optionally, the patient receives a magnetic resonance contrast agent 44, e.g. a bolus injection of a Gadolinium-Dithylene-Triamine-Penta-Acetate, to improve the vascular contrast, e.g. contrast-enhanced MRA is performed. An MRA sequence such as a time-of-flight (TOF) sequence, a black-blood angiography sequence, or the like, is applied by the sequence control processor 34 to effectuate acquisition of the contrast-enhanced MRA data. For non-contrast enhance MRA, the contrast agent 44 is omitted and an imaging sequence that intrinsically provides vascular contrast, such as the TOF technique, is applied. Typical TOF MRA parameters are: TE=6.7 ms, TR=27 ms, FOV=20 cm, PE=192; NSA=1, Flip angle=35; Gap=0 mm and matrix size 384×512. Those skilled in the art can tailor the pulse sequence programs and generate better quality images using the image parameter control and type of the weighting.

Regardless of the choice of MRA imaging modality or protocol, the k-space data is collected in the k-space memory 36 and reconstructed by the reconstruction processor 38 to generate the MRA volume image data 40. The MRA volume image data is in the form of a three-dimensional gray scale image representation of the examined area of the patient, which has good contrast for the vascular system relative to other body tissues of the patient 42.

However, the MRA volume image data 40 typically also includes some background noise as well as additional undesirable contrast due to unintended imaging of non-vascular systems such as bone tissue and body organs. There are a wide range of non-vascular structures having various geometries, shapes and sizes. Non-vascular shapes can include longitudinal, elliptical, circular, linear, protruding, fatty, blobby, thin line like. Some non-vascular structures may overlap the blood vessels. Especially problematic in clinical situations are images where vascular branches are hidden by these variable-geometry non-vascular structures. Furthermore, vascular structures can overlap each other. The arteries and veins typically run side by side in the body and can obscure one another. One example of such a problematic relative arterial/venous orientation is the typically close relative positioning of the carotid artery and the jugular vein, which makes separation of these vessels difficult in many angiographic images.

A three-dimensional post-acquisition filtering processor 46 processes the MRA volume image representation 40 to substantially filter out the background noise and the non-vascular contrast. The filtered vascular information is preferably graphically displayed on an appropriate user interface 48, and can of course also be stored electronically or on a magnetic storage medium, printed on paper, et cetera (not shown).

Figure 2:
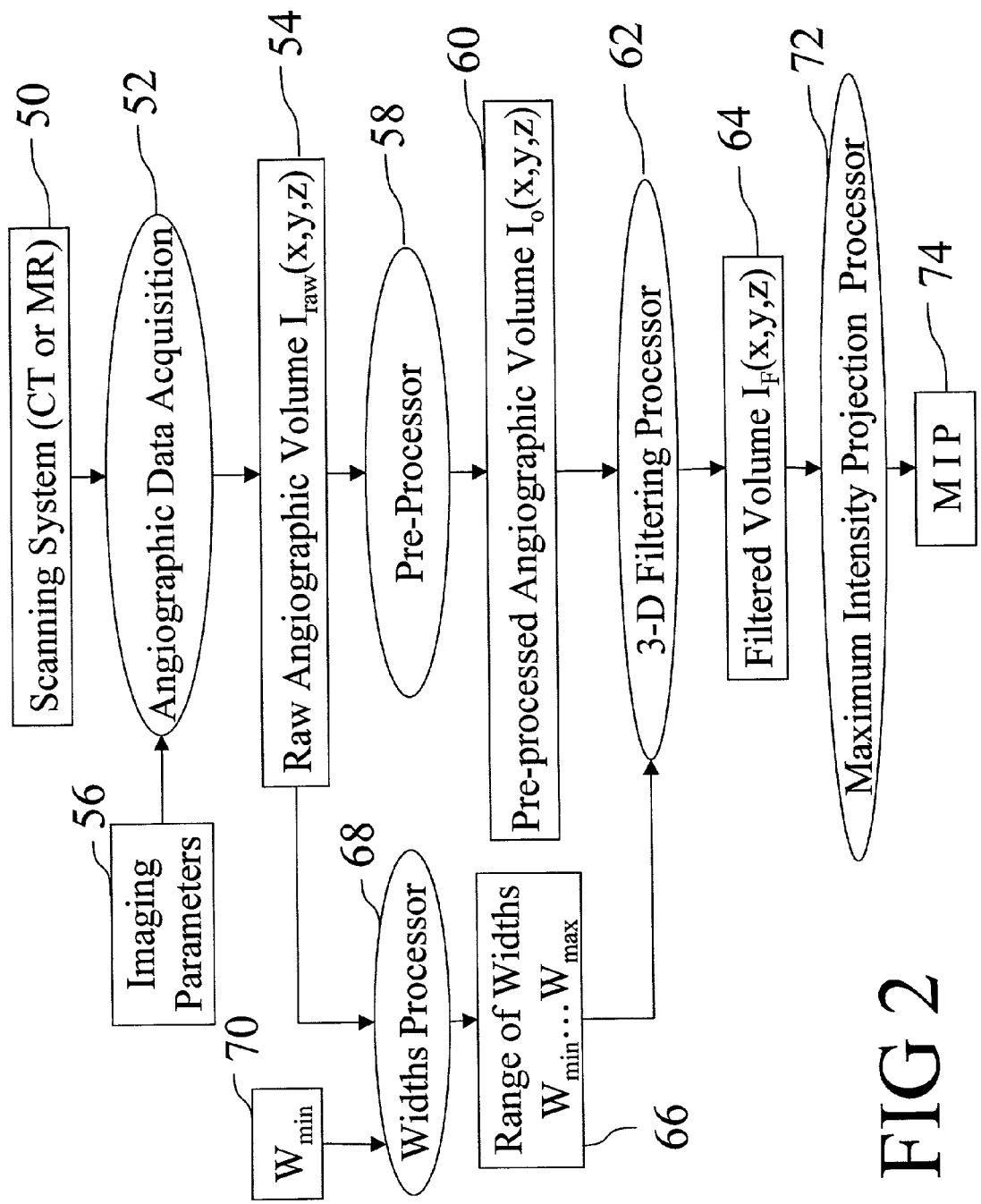
FIG. 2 shows a diagrammatic overview representation of a three-dimensional angiographic post-acquisition processing method that suitably practices an embodiment of the invention.

With reference now to FIG. 2, an overview of a preferred embodiment of a process implemented by the post-acquisition filtering processor 46 is described. An imaging scanner 50, such as illustrated in FIG. 1, acquires 52 angiographic data 54, which in the FIG. 1 MRI embodiment is reconstructed into the image memory 40. Instead of an MRI, the imaging scanner 50 could be a computed tomography (CT) scanner or other scanner or imaging modality capable of acquiring 52 gray scale volumetric angiographic data using suitable imaging parameters 56.

The acquired raw angiographic data $I_{raw}(x,y,z)$ 54 is typically in the form of a machine-specific format which may include non-cubic voxel dimensions, variable sampling rates, or other undesirable aspects. The raw data 54 is therefore preferably pre-processed 58 to generate a pre-processed angiographic volume $I_o(x,y,z)$ 60 that conforms to a pre-selected or standardized image format.

A three-dimensional filtering 62 produces a filtered volume image $I_F(x,y,z)$ 64 in which the non-vascular structure and background noise is substantially filtered out. The filtering 62 overcomes the difficulty of filtering angiographic volume images containing blood vessels spanning a range of widths by performing filtering at a series of representative widths $W_i$ spanning a range of widths 66 and then operatively combining the filtered volume images corresponding to the widths $W_i$ to create a final three-dimensional image 64 that includes blood vessels in the range of widths 66.

The range of widths 66 can be manually selected, e.g. based on a clinical knowledge of the likely range of blood vessel diameters in the imaged area of the patient. In a preferred embodiment, however, a widths processor 68 automates selection of the range 66. In the illustrated embodiment, a minimum width $W_{min}$ 70 is received, either as an operator input or as a default value, e.g. corresponding to the resolution of the scanning system 50. A maximum width $W_{max}$ is estimated from the raw angiographic volume (step not shown in FIG. 2) and the range 66 between $W_{min}$ and $W_{max}$ inclusive is divided into a series of width parameters $W_i$ that span the range.

The filtered volume angiographic image 64 can be manipulated using any appropriate method to produce a two-dimensional image representation that can be displayed on the display device 48 of FIG. 1. In the exemplary method overview shown in FIG. 2, a maximum intensity projection (MIP) process 72 is applied to produce MIP images 74. The maximum intensity projection process 72 is appropriate for white-blood angiographic techniques where the vascular structures appear bright (i.e., at high intensity) in the images. In the case of a black-blood angiographic technique, the maximum intensity projection process 72 would be replaced by a minimum intensity projection process, as is well-known to those of ordinary skill in the art.

Having provided an overview of the exemplary filtering process with reference to FIG. 2, the details of this exemplary process are discussed with reference to starting at FIG. 3.

Figure 3:
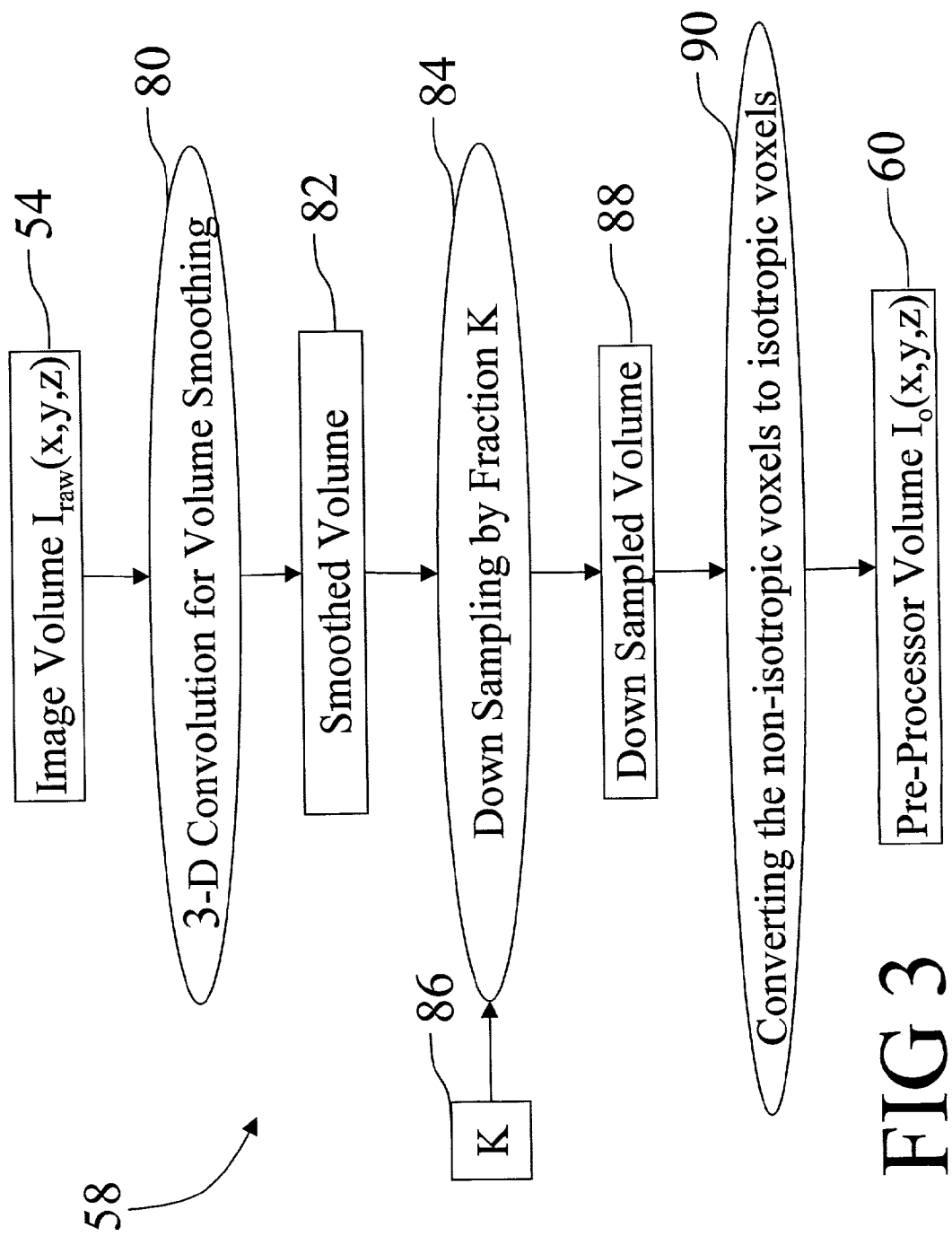
FIG. 3 shows a diagrammatic representation of the pre-processor component of the processing method of FIG. 2.

FIG. 3 shows an exemplary pre-processor 58. A three-dimensional convolution filtering 80 is advantageously applied to smooth produce a smoothed volume image 82. Optionally, the size of this volume is reduced by down-sampling 84 by a factor K 86 to produce a down-sampled volume 88 in conformance with a pre-selected image format. Additionally, the data is converted 90 into isotropic voxels if necessary, e.g. using trilinear interpolation, to produce the pre-processor volume $I_o(x,y,z)$ 60.

Figure 4:
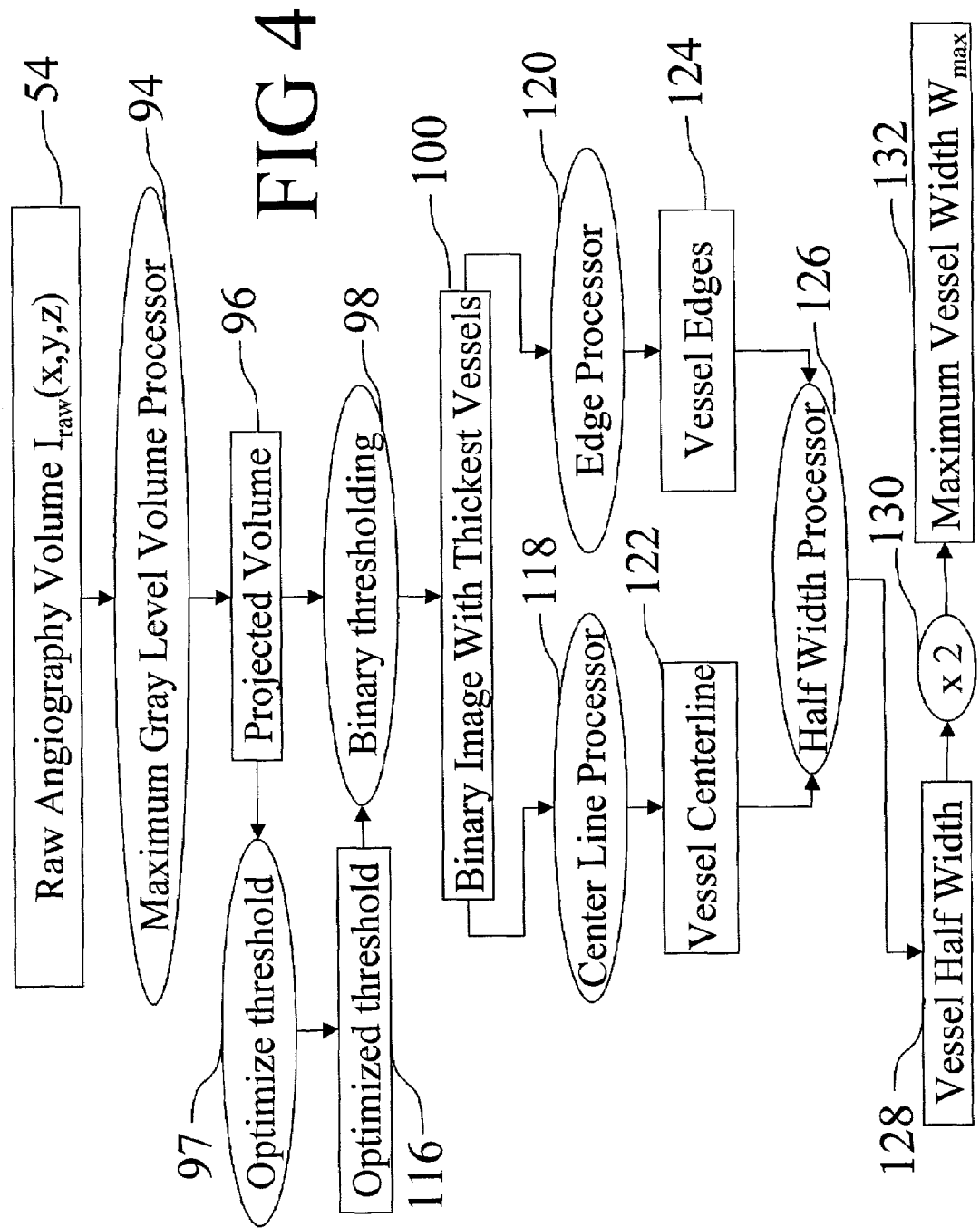
FIG. 4 shows a diagrammatic representation of the maximum width identification component of the processing method of FIG. 2.
Figure 5:
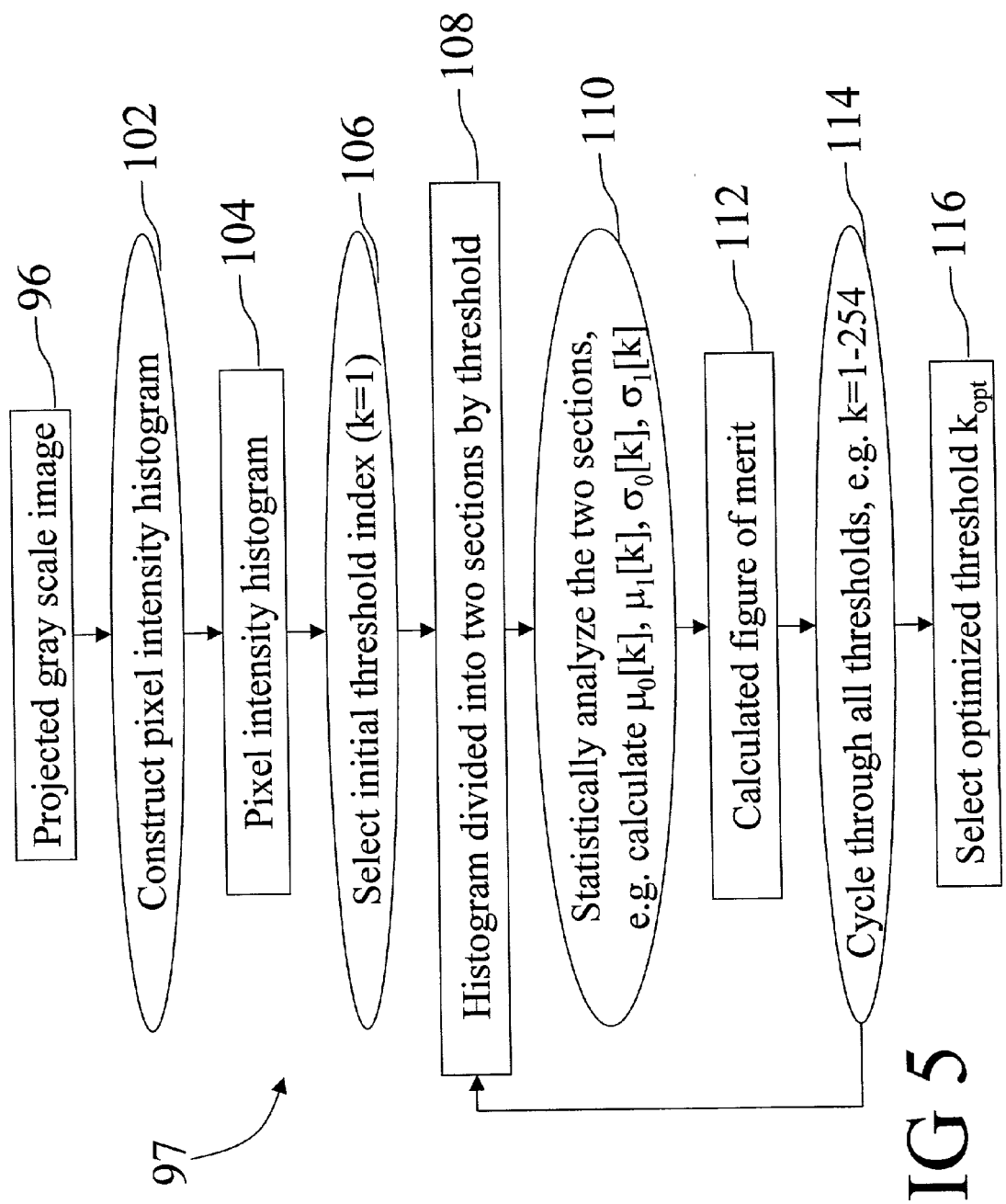
FIG. 5 shows a diagrammatic representation of an exemplary optimization of the binarization threshold suitable for use in the maximum width identification of FIG. 4.

With reference to FIGS. 4 and 5, a preferred method for estimating a maximum blood vessel width imaged in the angiographic data is described. The maximum width is preferably estimated from the raw angiographic volume $I_{raw}(x,y,z)$ 54 to ensure that the maximum width is extracted. The three-dimensional image $I_{raw}(x,y,z)$ 54 is projected 94, e.g. using a maximum intensity projection or a minimum intensity projection (MIP) to produce a two-dimensional gray scale image 96. The image 96 is binarized 98 to create a corresponding a binary image 100.

The binarizing 98 preferably incorporates a threshold optimization 97 which optimizes a threshold value 116 to effectuate differentiation of the vascular regions from the non-vascular regions. For example, the threshold preferably thresholds pixels representing blood vessels as binary "1" and pixels representing non-vascular regions as binary "0".

With particular reference to FIG. 5, in a preferred embodiment the threshold is selected by constructing 102 a histogram 104 of the pixel intensities. In constructing 102 the histogram 104, the number of occurrence (i.e., frequency $n_i$) of pixels with intensity i is plotted against the gray scale intensity i which ranges from 1 to L. In a preferred embodiment, the histogram is normalized to define normalized frequencies $p_i = n_i/N$ where N is the total number of pixels in the image.

A threshold index k is then selected 106, e.g. for 8-bit intensities where L=256, an initial threshold of 1. The threshold will divide the histogram into two sections 108, a first section below the threshold and a second section above the threshold. The partitions have the relative frequencies:

$$\omega_o[k] = \sum_{i=1}^{k} p_i, \; \omega_1[k] = \sum_{i=k+1}^{L} p_i \quad (1)$$

where $\omega_o$ is the fraction of pixels in the first partition, $\omega_1$ is the fraction of pixels in the second partition, and L is the number of levels.

Those skilled in the art will recognize that the optimal threshold will divide the histogram into a first part containing pixels corresponding to the vascular regions and a second part containing pixels corresponding to the non-vascular regions. Further, it will be recognized that the vascular pixels will typically form a histogram having a peaked distribution centered about an average vascular image intensity, while the non-vascular regions will typically form a peaked distribution about an average non-vascular background intensity.

The optimized threshold is therefore identifiable using statistical analysis, e.g. by calculating 110 the mean values for the partitions:

$$\mu_o[k] = \sum_{i=1}^{k} i \frac{p_i}{\omega_o[k]}, \; \mu_1[k] = \sum_{i=k+1}^{L} i \frac{p_i}{\omega_1[k]} \quad (2)$$

and the standard deviations or variances for the partitions:

$$\sigma_o^2[k] = \sum_{i=1}^{k} \frac{(i - \mu_o[k])^2 p_i}{\omega_o[k]}, \; \sigma_1^2[k] = \sum_{i=k+1}^{L} \frac{(i - \mu_1[k])^2 p_i}{\omega_1[k]}. \quad (3)$$

A suitable figure of merit is defined 112 based on these statistical parameters, for example:

$$\eta[k] = \mu_o[k]\sigma_o^2[k] + \mu_1[k]\sigma_1^2[k] \quad (4).$$

By iterating over the possible threshold values 114, e.g. over the range 1–254 for an 8-bit intensity gray scale with L=256, the figure of merit 112 and thus the threshold can be optimized to yield an optimized threshold 116 according to:

$$k_{opt} = \underset{k}{\mathrm{argmin}}\{\eta\,[k]\}. \tag{5}$$

This optimization function is the ratio of the in-between class variance to the total variance, i.e. $\sigma_B^2/\sigma_T^2$.

With reference to FIG. 4, the binarized image 100 is analyzed to estimate the maximum blood vessel diameter. In a preferred embodiment, the blood vessels are analyzed with respect to the centerlines 118 and the edges 120 to identify the blood vessel centerlines 122 and the blood vessel edges 124, respectively. A half-width processor 126 combines the centerline 122 and edge 124 information to obtain the vessel half-width 128. The half-width 128 is doubled 130 to obtain the maximum blood vessel width $W_{max}$ 132.

Figure 6:
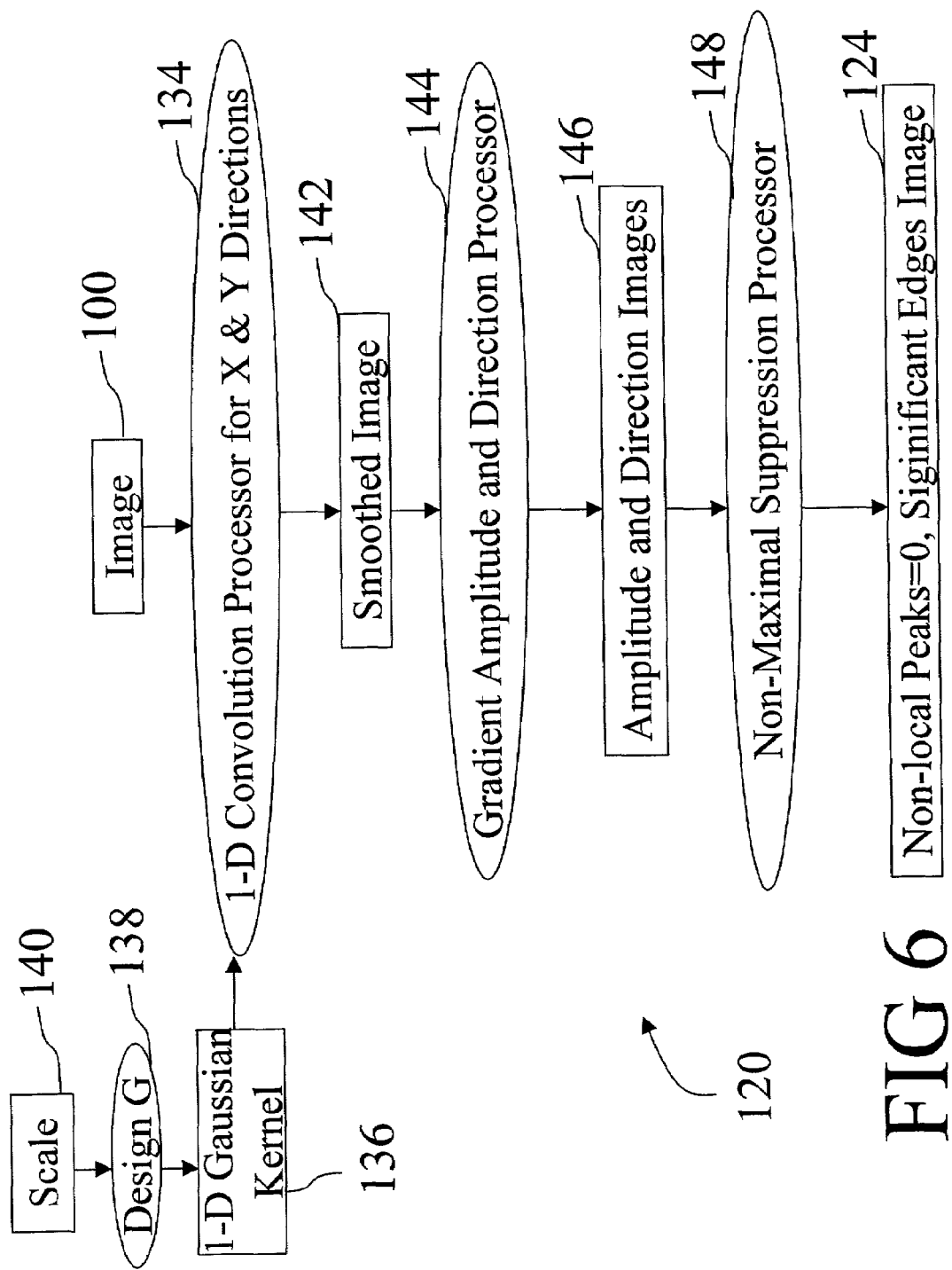
FIG. 6 shows a diagrammatic representation of an exemplary edge processor suitable for use in the maximum width identification of FIG. 4.

With reference to FIG. 6, a preferred embodiment of the edge processor 120 is described. The image 100 is smoothed 134, e.g. using a one-dimensional convolution processor operating successively in the x- and y-directions on a Gaussian kernel 136 designed 138 at a pre-selected scale 140 to produce a smoothed volume 142. The amplitude and directional components of the gradient are calculated 144, e.g. using finite difference methods, to produce amplitude and gradient images 146. A non-maximal suppression processor 148 preferably removes undesired non-local background variations that could interfere with the edge detection, and the remaining image structure corresponds to the edges 124.

The edge detection method described with reference to FIG. 6 has the advantage of being applicable to either gray scale or binary images, and computes the true positive edges accurately. However, those skilled in the art can replace the edge detection processor of FIG. 6 with other types of edge detection processors which can give similar results. Edge detection methods based on Gaussian models, derivatives of Gaussian models, anisotropic diffusion edge detection, or PDE based edge detection are appropriate.

Figure 7:
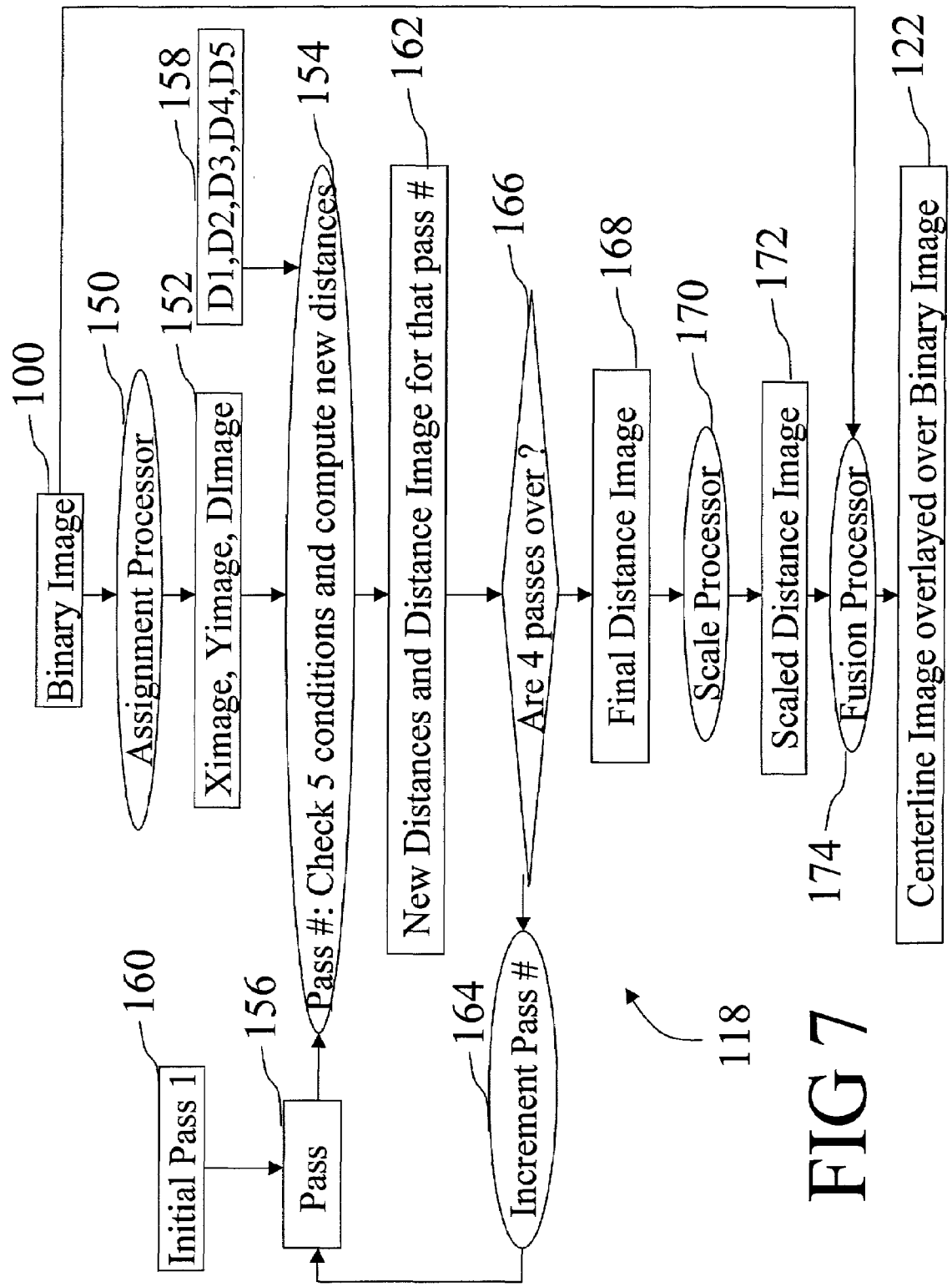
FIG. 7 shows a diagrammatic representation of an exemplary centerline processor suitable for use in the maximum width identification of FIG. 4.

With reference to FIG. 7, a preferred embodiment of the centerline processor 118 is described. The binary image 100 is converted into three image matrices by an assignment processor 150, namely an Ximage, a Yimage, and a Dimage 152. In the Ximage, the column positions of the grid is loaded. In the Yimage, the row position of the grid is loaded. In the Dimage, the distances are set to "0" to start with. This means for all the pixels in the image, the distance value is assigned to be 0.

A distance processor 154 performs distance calculations over four passes 156. In each pass 156, the distance processor 154 checks five conditions D1, D2, D3, D4, and D5 158 against the original distances. Each distance D(r) (c) is compared with the distances D1, D2, D2, D3 and D5. In the case of D1, a new row and a new column is computed. For this new row and new column, the distance is noted. If this distance is less than the D(r,c) stored in Dimage, then a new distance is computed. This is repeated for the locations (−1,0) and (−1,−1). For D2, we check for two left shift and one right shift, that is (−2,−1) and then (−1,−2). Similarly, for D3, the locations(−3,−1), (−3,−2) and (−2,−3) and (−1,−3) are checked. For D4, the locations (−4,−1), (−4,−3), (−3,−4) and (−1,−4) are checked. For D5, the locations (−5,1), (−5,2), (−5,3), (−5,4), (−1,5), (−2,5), (−3,5), (−4,5) are checked.

After the distances are updated according to an initial pass 160, a new distance image Dimage is generated 162. The distance processing 154 is repeated 164 until all four passes are performed 166. The four passes are performed in the following order. Pass 1 (i.e., the initial pass 160) occurs from left to right and top to bottom. Pass 2 occurs from top to bottom and from right to left. Pass 3 occurs from bottom to top and from left to right. Pass 4 occurs from bottom to top and from right to left. At the end of the four passes, the final distance image 168 is obtained, in which the centerlines have the highest distance value and will thus be the brightest binary objects in the image.

A scaling processor 170 scales the final Dimage 168 to produce a scaled distance image 172 in which the centerlines are uniformly bright on a dark background. Finally, a fusion processor 174 combines the centerline image 172 with the original binary image 100 to produce the vessel centerline image 122.

Figure 8:
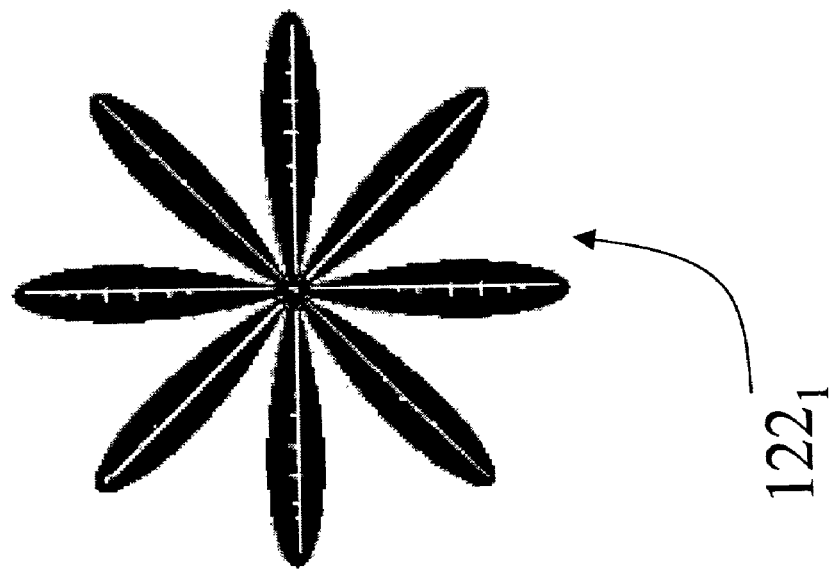
FIG. 8 shows an exemplary complex multi-nodal "flower-shaped" synthetic structure input to the centerline processor of FIG. 7 along with the output of the centerline processor for this input.
Figure 8:
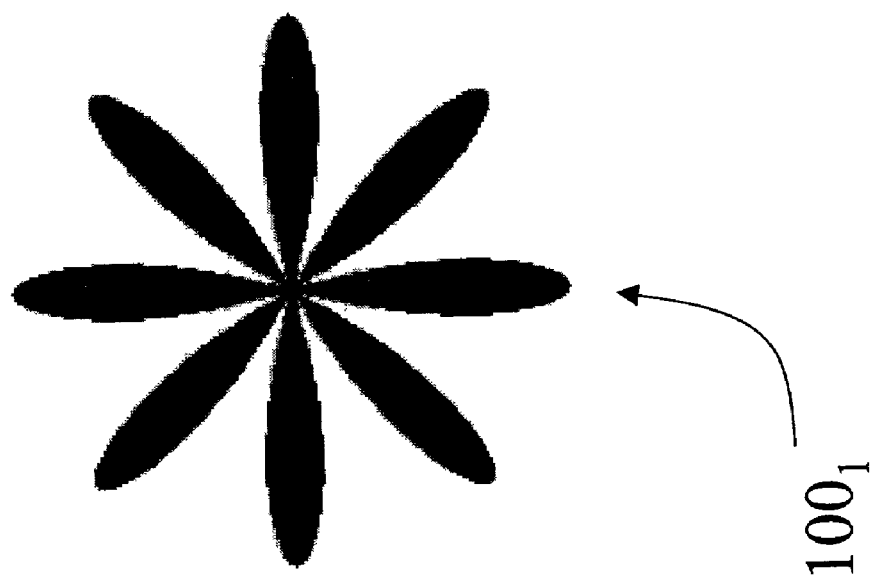

FIG. 8 shows the effectiveness of the centerline processor 118 of FIG. 7. A rather complex eight-petaled flower-shaped synthetic structure 1001 was processed using the method 118 to produce the centerline image $122_1$. The centerline for each of the eight interconnected lobes (i.e., "petals") is seen to have a clearly defined centerline. The described method advantageously uses an efficient four-pass decomposition to obtain the blood vessel centerline. However, the method 118 of FIG. 7 is exemplary only, and those skilled in the art will recognize that other methods can be substituted for finding the centerlines.

With reference back to FIGS. 2 and 4, the maximum width $W_{max}$ 132 is identified according to the method shown in FIG. 4. The minimum width $W_{min}$ 70 is obtained, e.g. as a user input or calculated based on the image resolution. The range of widths 66 is then defined, for example by dividing the range $\{W_{min} \ldots W_{max}\}$ into equal intervals on a linear, logarithmic, or other scale, or by other suitable division means. Having obtained the range of width parameters 66, the three dimensional filtering process 62, which receives the widths 66 as an input, is performed.

Figure 9:
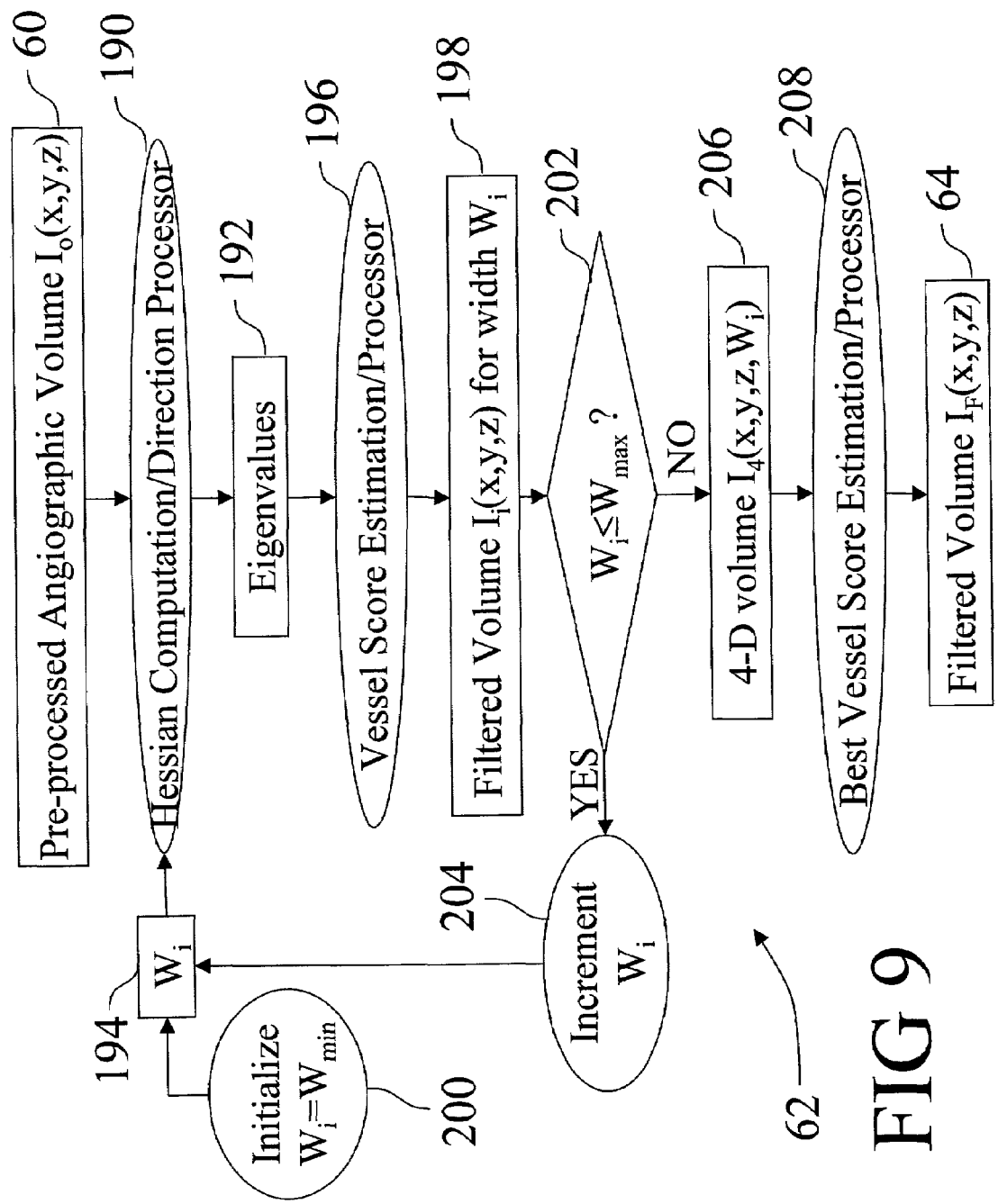
FIG. 9 shows a diagrammatic overview representation of the three-dimensional filtering component of the processing method of FIG. 2.

With reference to FIG. 9, the three-dimensional filter processing 62 is described. The pre-processed angiographic volume $I_o(x,y,z)$ 60 is analyzed using a Hessian matrix computation-based vessel direction processor 190 from which the eigenvalues 192 of the Hessian matrix are obtained. As is known to those skilled in the art, the Hessian matrix is a 3×3 matrix of second order spatial derivatives of the pre-processed image 60. The eigenvalue decomposition of the Hessian matrix provides the three orthonormal eigenvectors 192 and corresponding eigenvectors (not shown) which are invariant up to a scaling factor. The eigenvalues along with direction information contained in the associated eigenvectors locally describes the second order structure of the image 60. The second order structure emphasizes the ridges and valleys of the image and is thus particularly suitable for use in angiographic segmentation and filtering.

In the present embodiment, the second order derivatives comprising the Hessian matrix are estimated at a scale corresponding to a width $W_i$ 194 of the range of widths 66 (FIG. 2). Thus, the Hessian matrix computed in the step 190 contains spatial information on the scale of the width $W_i$ 194.

Information regarding the blood vessel direction and its spatial properties, e.g. diameter, connectivity with other regions of the vascular system, etc., is extracted from the eigenvalues in a process 196 that assigns a vessel score to each pixel of the image 60 to generate a filtered volume $I_i(x,y,z)$ 198 that substantially enhances contrast of vascular structures on the width scale $W_i$ 194 while suppressing vascular structures of other spatial widths as well as non-vascular structures.

The generation of the filtered volume $I_i(x,y,z)$ 198 is repeated for all the widths in the range of widths 66 of FIG. 2. In the exemplary embodiment of FIG. 6, $W_i$ 194 is initialized to $W_i=W_{min}$ 200. The Hessian matrix calculation and extraction 190 of the eigenvalues 192, the vessel score estimation processing 196, and the generation of the filtered volume $I_i(x,y,z)$ 198 corresponding to width $W_i$ is performed. If the width $W_i$ is less than $W_{max}$ 202, then $W_i$ is incremented 204 and the process 190, 192, 196, 198 is repeated until the filtered volume $I_i(x,y,z)$ 198 corresponding to each width $W_i$ 194 of the range of widths 66 is generated. The result 206 can be expressed as a four-dimensional volume $I_4(x,y,z,W_i)$.

The result 206 can alternatively be viewed as providing for each voxel of the pre-processed volume 60 a list of vessel scores corresponding to the plurality of widths $W_i$ 194. Each vessel score indicates the likelihood that the corresponding voxel is included in a vascular structure having width $W_i$ 194. By selecting 208 the highest vessel score for each voxel from among the list of scores corresponding to that voxel, the filtered volumes $I_i(x,y,z)$ 198 are operatively combined to generate the filtered volume 64.

Figure 10:
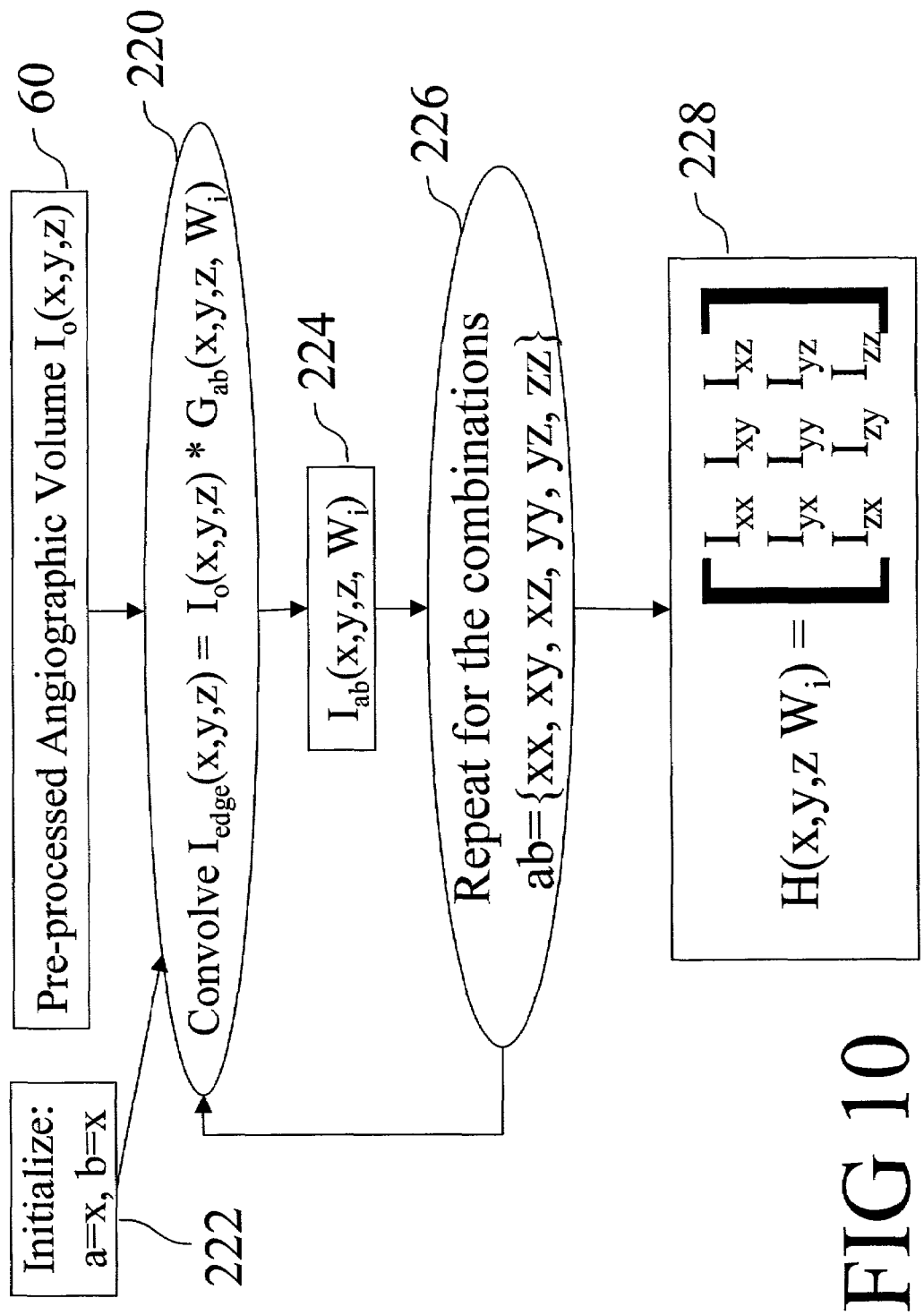
FIG. 10 shows a diagrammatic representation of the Hessian matrix estimation.

With reference to FIG. 10, the estimation of the Hessian matrix at the width $W_i$ 194 (FIG. 9) is described. The method used to estimate the required second order derivatives of the pre-processed angiographic volume $I_o(x,y,z)$ 60 is to convolve 220 the image $I_o(x,y,z)$ 60 with a second order derivative of a Gaussian distribution of the form:

$$G(r, W_i) = \frac{1}{\sqrt{2\pi}W_i} \exp\left(-\frac{\|r\|^2}{2W_i^2}\right) \quad (6)$$

where r is a position vector. Those skilled in the art will recognize this as a scale space framework where differentiation is defined as a convolution with a derivative of a Gaussian, and will further recognize that the Gaussian distribution of equation (1) is a conventional Gaussian distribution in which the variance of the distribution corresponds to the width $W_i$ 194. The image $I_o(x,y,z)$ 60 is convolved 220 with a derivative $G_{ab}(x,y,z,W_i)$ where the differentiation parameters a and b each correspond to one of the spatial coordinates x, y, or z, e.g. initially a=x and b=x 222. The convolving 220 is performed according to:

$$\partial L(x,y,z,W_i) = W_i^\gamma I_o(x,y,z) * \partial G(x,y,z,W_i) \quad (7),$$

where "*" is the convolution operator, and yields an estimate of the second order derivative $I_{ab}(x,y,z,W_i)$ 224, i.e. yields the second order derivative of the image $I_o(x,y,z)$ 60 with respect to the coordinates a and b estimated on the scale of the width $W_i$ 194. The parameter γ is the Lindeberg constant and is used to define a family of normalized derivatives. This normalization is particularly important for a fair comparison of the response of differential operators at multiple scales. With no scales used, γ=1.0. The second order information, i.e. the information contained in the Hessian matrix, has an intuitive justification in the context of tubular structure detection. The second derivative of a Gaussian kernel at scale $W_i$ 194 generates a probe kernel that measures the contrast between regions inside and outside the range $(-W_i, W_i)$. The Taylor expansion of the image $I_o(x,y,z)$ 60 gives the second order directional derivative as:

$$\delta r^T H(r, W_i) \delta r = \left(\frac{\partial}{\partial \delta r}\right)\left(\frac{\partial}{\partial \delta r}\right) I(r, W_i). \quad (8)$$

The main concept behind the eigenvalue of the Hessian is to extract the principle directions in which the local second order structure of the image can be decomposed. Since this directly gives the direction of the smallest curvature (along the direction of the vessel), application of several filters in multiple orientations is avoided. This latter approach is computationally more expensive and requires discretization of the orientation space. If $\lambda_{Wi,k}$ is the eigenvalue corresponding to the $k^{th}$ normalized eigenvector $u_{o,k}$ of the Hessian matrix $H_{Wi}$ computed at the scale $W_i$, then the eigenvalues are defined as:

$$H_{W_i} u_{W_i,k} = \lambda_{W_i,k} u_{W_i,k} \quad (9).$$

Equation (9) has a geometrical interpretation. The eigenvalue decomposition extracts three orthonormal directions that are invariant up to a scaling factor when mapped by the Hessian matrix. In particular, a spherical neighborhood centered at $r_o$ having a radius of unity will be mapped by the Hessian matrix onto an ellipsoid whose axes are along the directions given by the eigenvectors of the Hessian matrix and the corresponding axis semi-lengths are the magnitudes of the respective eigenvalues. This ellipsoid locally describes the second order structure of the image. Thus, the problem comes down to estimating the eigenvalues and eigenvectors at each voxel location in the three-dimensional volume $I_o(x,y,z)$ 60.

To generate an approximation on the scale of width $W_i$ 194 of the Hessian matrix, the convolving 220 and extraction of the spatial derivative $I_{ab}$ 224 is repeated 226 for the six combinations of a=x, y, z and b=x, y, z, e.g., ab={xx, xy, xz, yy, yz, zz}. The three remaining combinations (ab=yx, zx, zy) are generated automatically because the Hessian matrix is a symmetric matrix. The resulting second order derivatives $I_{ab}$ 224 arranged to form a conventional Hessian matrix 228 estimated at the scale of the width $W_i$ 194.

Figure 11:
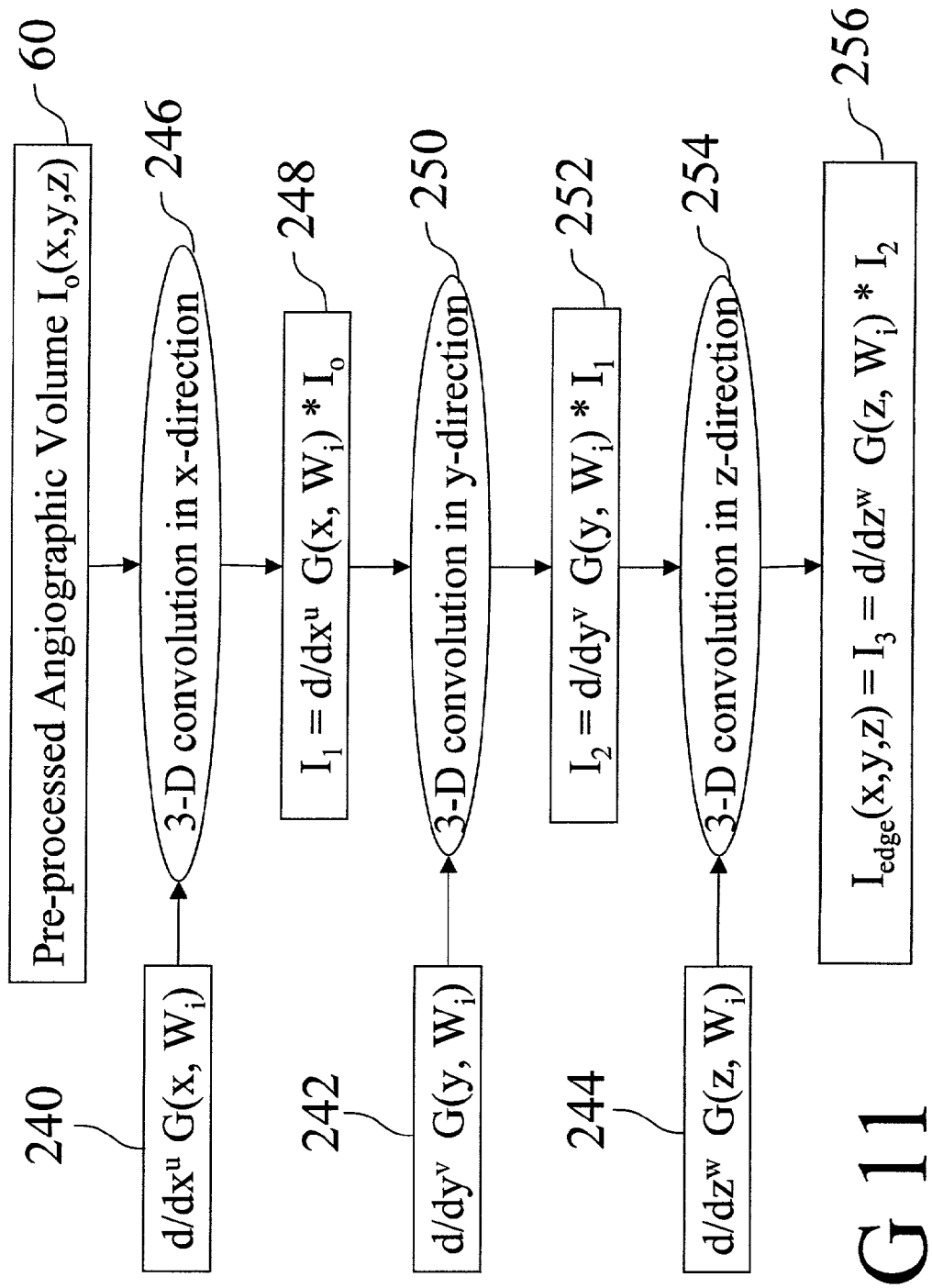
FIG. 11 shows a diagrammatic representation of the calculation of the edge space by convolution with a Gaussian kernel using a separable computation mode.

The convolving 220 of equation (7) is an order $O(k^3)$ calculation. As shown in FIG. 11, this calculation is alternatively advantageously performed in separable mode according to:

$$I_o(x, y, z) * \frac{\partial^2 G}{\partial x^u \partial y^v \partial x^w}(x, y, z, W_i) = \frac{d^u}{dx^u}G(x, y, z, W_i) * \left[\frac{d^v}{dy^v}G(x, y, z, W_i) * \left(\frac{d^w}{dz^w}G(x, y, z, W_i) * I_o(x, y, z)\right)\right] \quad (10)$$

where u+v+w=2 corresponding to a second order derivative and "*" is the convolution operator. The convolution according to equation (10) is only of order O(3k), i.e. the convolution occurs in linear time. As shown in FIG. 11, the first order derivatives of the Gaussian are calculated with respect to the spatial coordinates x, y, z 240, 242, 244 and the resulting first order derivatives successively convolved into the angiographic volume $I_o(x,y,z)$ 60 in the steps 246, 250, 254 to generate a first intermediate image volume $I_1(x,y,z,W_i)$ 248, a second intermediate image volume $I_2(x,y,z,W_i)$ 252, and a final edge volume $I_{edge}(x,y,z,W_i)$ 256.

With the derivative calculated using the separable Gaussian convolution of equation (10), the normalized edge volume is calculated, e.g. according to equation (7) with γ=0.7 for the second order derivatives.

Figure 12:
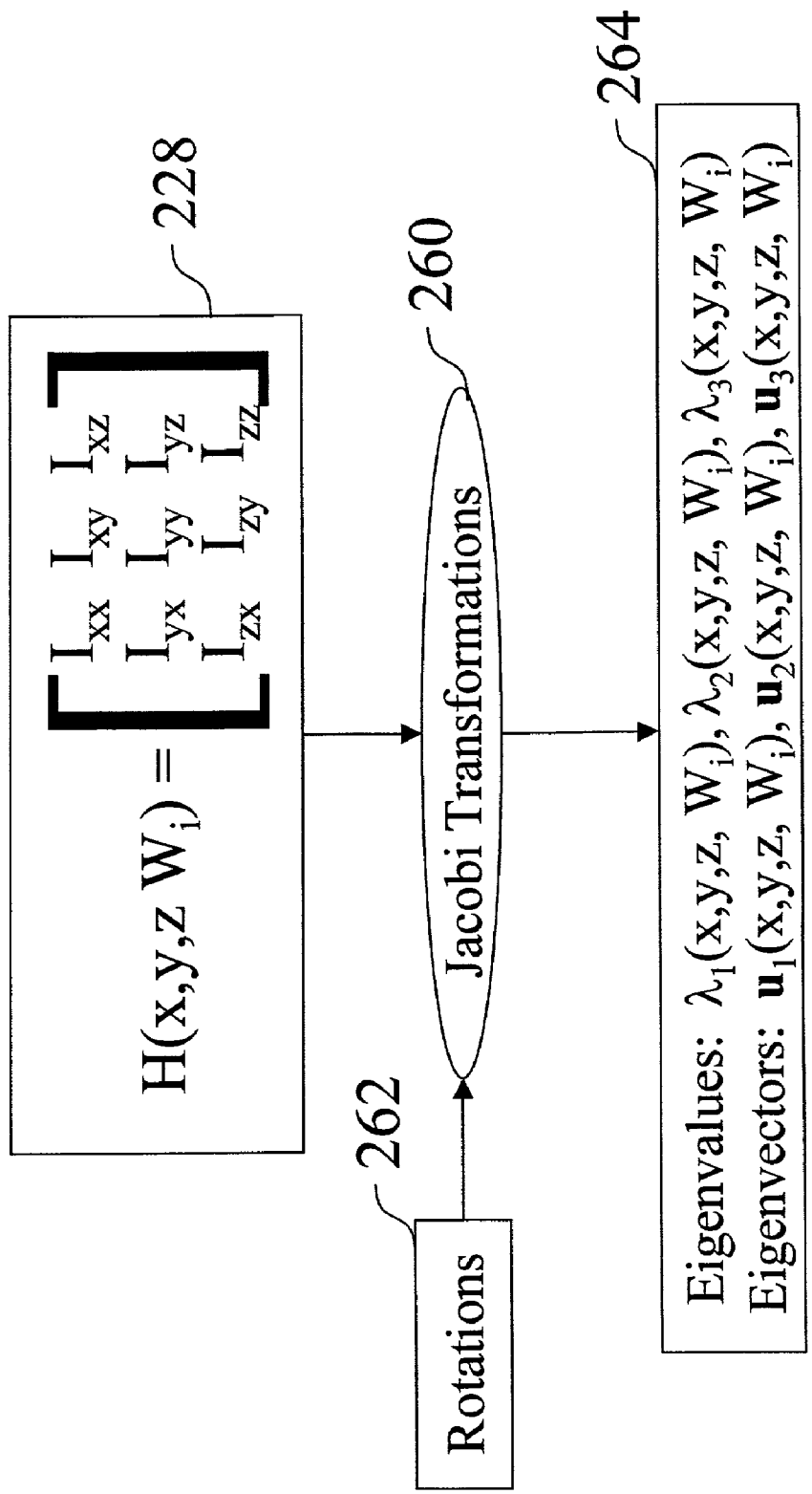
FIG. 12 shows a diagrammatic representation of the calculation of the eigenvalues and eigenvectors of the Hessian matrix.

With reference to FIG. 12, once the Hessian matrix 228 is calculated according to FIGS. 10 and 11, it is diagonalized to obtain the eigenvalues and eigenvectors. In an exemplary method, the eigenvalues and eigenvectors are extracted using an ellipsoidal processor by performing Jacobi transformations 260 with appropriate rotations 262, such mathematical manipulations being well known to the art. The eigenvalues $\lambda_1(x,y,z,W_i)$, $\lambda_2(x,y,z,W_i)$, $\lambda_3(x,y,z,W_i)$ and eigenvectors $u_1(x,y,z,W_i)$, $u_2(x,y,z,W_i)$, $u_3(x,y,z,W_i)$ 264 are extracted from the diagonalized matrix.

Figure 13:
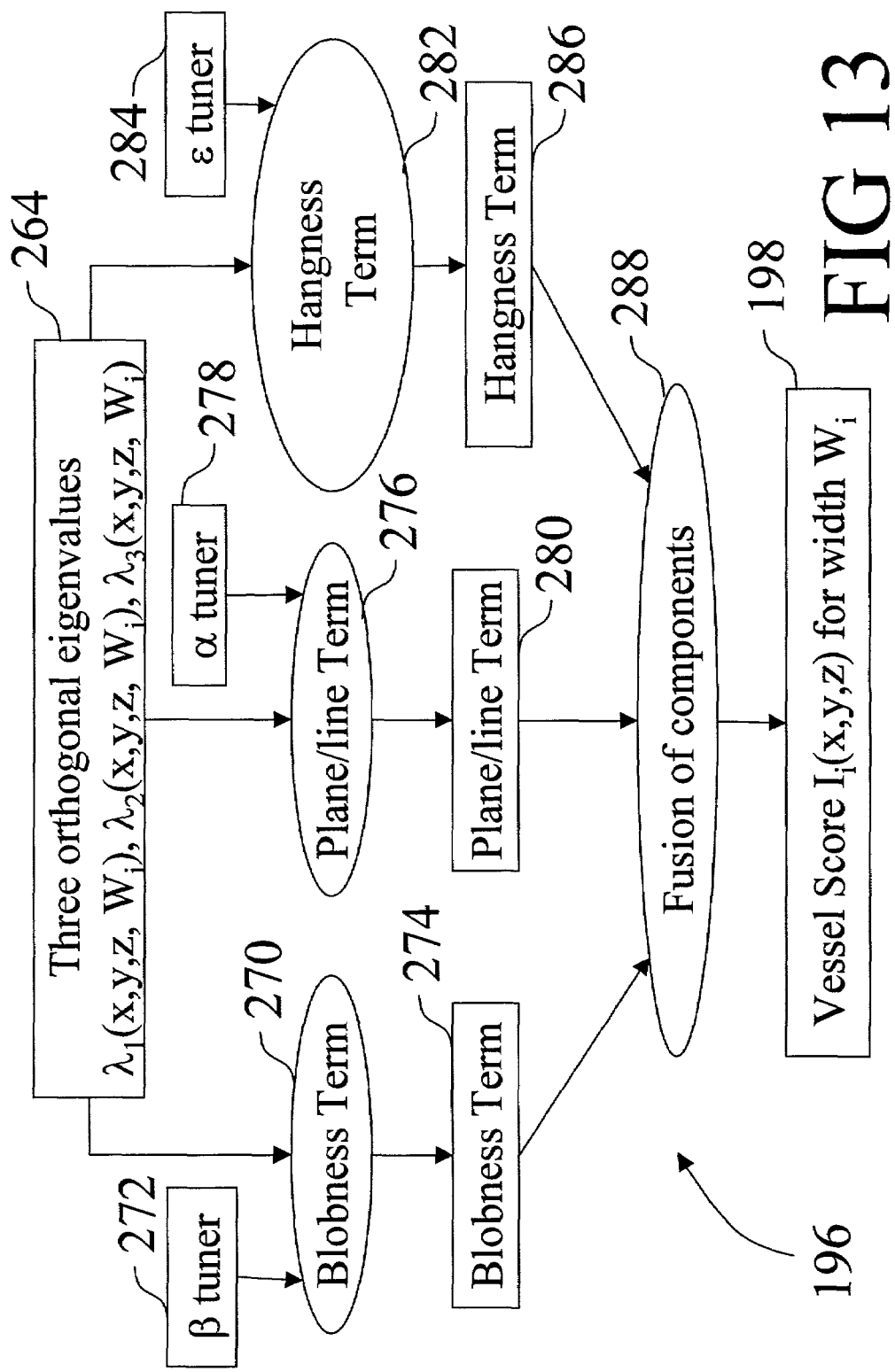
FIG. 13 shows a diagrammatic representation of the vessel score estimation processing of FIG. 9.

With reference to FIG. 13, the eigenvalues 264 of the Hessian matrix $H(x,y,z, W_i)$ 228 are advantageously applied in characterizing the likelihood that the voxel at (x, y, z) is included in a blood vessel of diameter $W_i$ 194. To so characterize the voxel, a voxel score is computed according to:

$$VS(\lambda_1, \lambda_2, \lambda_3, \gamma) = \begin{cases} 0 \text{ if } \lambda_2 > 0 \text{ or } \lambda_3 > 0 \\ \left(1 - \exp\left(-\frac{R_A^2}{2\alpha^2}\right)\right)\exp\left(-\frac{R_B^2}{2\beta^2}\right)\left(1 - \exp\left(-\frac{S^2}{2\epsilon^2}\right)\right) \end{cases} \quad (11)$$

where $$R_A^2 = \frac{|\lambda_2|}{|\lambda_3|}, \quad (12)$$

$$R_B^2 = \frac{|\lambda_1|}{\sqrt{|\lambda_2\lambda_3|}}, \quad (13)$$

$$S = \sqrt{\lambda_1^2 + \lambda_2^2 + \lambda_3^2} \quad (14)$$

$\lambda_1$ corresponds to the eigenvector in the blood vessel direction, γ is the Lindeberg constant known to the art, and α, β, and ε are thresholds that control the sensitivity of the filter to the image features of blobbiness, plane/line difference, and hangness, respectively.

The vessel score of equation (11) is further described with reference to FIG. 13. The orthogonal eigenvalues 264 are the image inputs to the vessel score processor 196. The overall vessel score expression of equation (3) can be decomposed into three components. A blobbiness or fatness term 270 is given by:

$$\text{blobbiness} = \exp\left(-\frac{R_B^2}{2\beta^2}\right) \quad (15)$$

where a tuning input β 272 controls the sensitivity of the filter to blobbiness. A typical value is β=0.5. The tuned filtering produces a blobbiness term 274. This term indicates the deviation from fatness by taking the ratio of the volume to the cross-section of the 3-D ellipsoids of second order. This ratio is the same as taking the three magnitudes of the three eigenvalues $\lambda_1$, $\lambda_2$, $\lambda_3$. Defining $\lambda_1$ as corresponding to the direction along the major axis of the ellipsoid, i.e. corresponding to the blood vessel axis, the fatness or blobbiness is computed using the norm of $\lambda_1$ to the square root of the product $\lambda_2 * \lambda_3$ as shown in equation (13) above. However, the blobbiness cannot distinguish between a line and a planar structure.

A second filtering gives the in-plane or plane/line difference 276:

$$\left(1 - \exp\left(-\frac{R_A^2}{2\alpha^2}\right)\right) \quad (16)$$

where a tuning input α 278 controls the sensitivity of this filter. A typical value is α=0.5. The tuned filtering produces an in-plane or plane/line difference term 280. This term indicates the ratio of the largest area of cross-section to the largest axis of this cross-section represented by $\lambda_2$ and $\lambda_3$. Thus, the in-plane or plane/line difference is computed using the norm of $\lambda_2$ to $\lambda_3$ as indicated in equation (12) above.

Both the blobbiness term 274 and the in-plane term 280 are geometry factors which are gray level invariant, i.e. they remain constant under intensity re-scaling. Additional information about the likelihood that the voxel under consideration is part of a blood vessel of diameter $W_i$ 194 is contained in the intensity contrast and the connectivity of the voxels in the three-dimensional volume. This third "hangness" term is given by 282:

$$\left(1 - \exp\left(-\frac{S^2}{2\epsilon^2}\right)\right) \quad (17)$$

where a tuning input ε 284 controls the sensitivity of this filter. A typical value is ε=0.5. The tuned filtering produces a hangness term 286. This term incorporates the observation that in angiography the vascular structure is typically brighter than the background due to the selective vascular imaging. The background dominant structures are suppressed in this filter by emphasizing derivatives of high signal content. Thus, the hangness term is computed using the energy of the Hessian which is the norm of the sum of the squares of the eigenvalues as shown in equation (14) above.

The three filtered terms, i.e. the blobbiness term 274, the in-plane term 280, and the hangness term 286 are fused 288 according to equation (11) to generate the vessel score 198 for the width $W_i$ 194.

With reference back to FIG. 2 and FIG. 9, the filtered volume $I_i(x,y,z,W_i)$ 198 corresponding to each $W_i$ 194 of the range of widths 66 is calculated. These can be combined into a four-dimensional volume $I_4(x,y,z,W_i)$ 206 or can be combined to produce a list of vessel scores corresponding to the plurality of widths $W_i$ 194 for each voxel of the pre-processed volume $I_o(x,y,z)$ 60. Each vessel score indicates the likelihood that the corresponding voxel is included in a vascular structure having width $W_i$ 194. By selecting 208 the highest vessel score for each voxel from among the list of scores corresponding to that voxel, the filtered volumes $I_i(x,y,z)$ 198 are operatively combined to generate the filtered volume 64.

Figure 14:
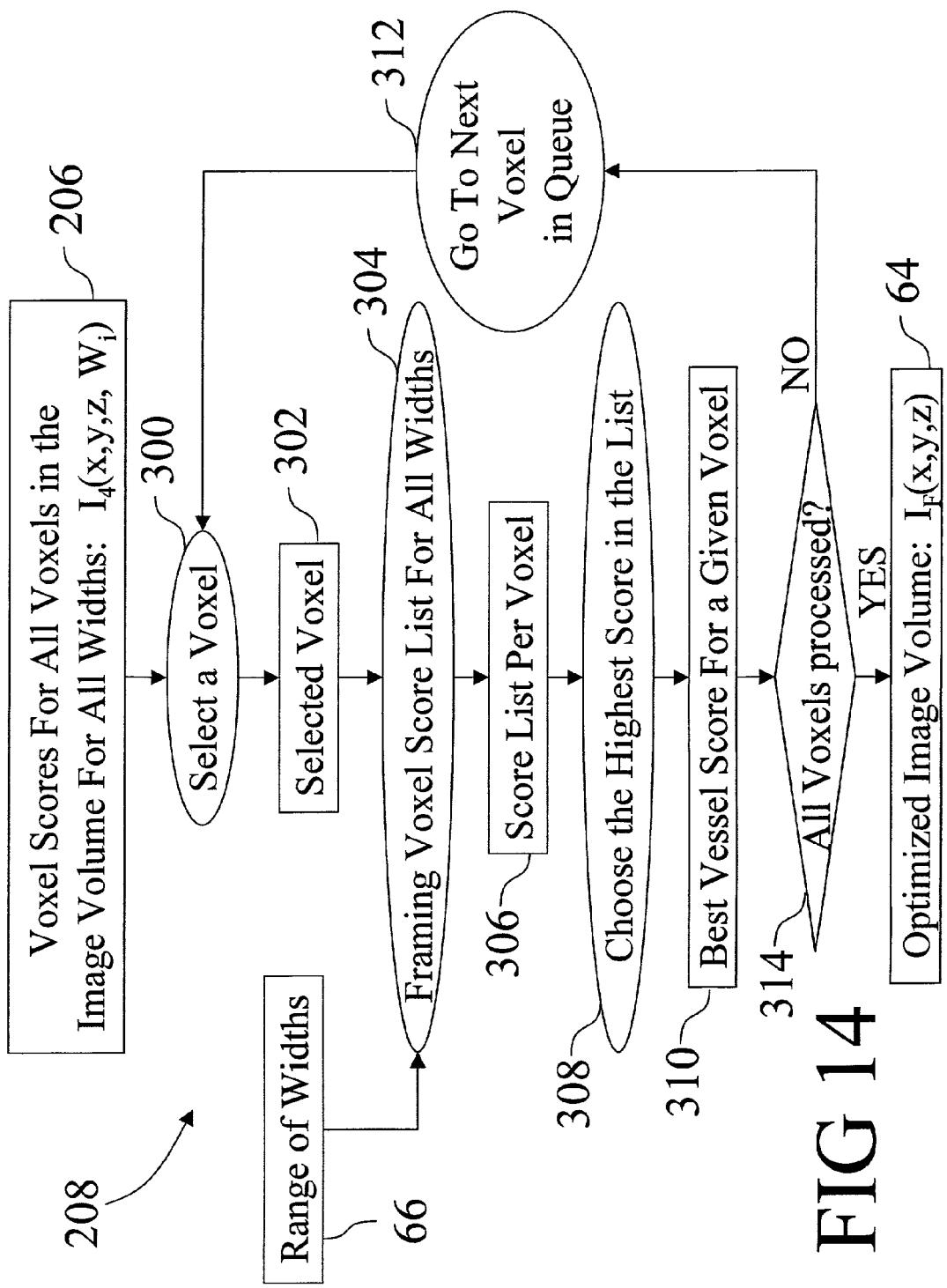
FIG. 14 shows a diagrammatic representation of the vessel score optimization processing.

With reference to FIG. 14, an exemplary embodiment of the selection processor 208 is described. The processor 208 receives the four-dimensional volume $I_4(x,y,z,W_i)$ 206 as input. A voxel 302 is selected 300. For this voxel 302, a voxel score list is formed 304 comprising the vessel score for that voxel corresponding to each width $W_i$ 194 in the range of widths 66. The resulting vessel scores list 306 is searched 308 to identify the best vessel score 310 for that voxel. This best vessel score 310 becomes the voxel intensity value in the final image $I_F(x,y,z,W_i)$ 198. The optimization processor 208 goes to the next voxel 312 and repeats the selection process until all voxels have been processed 314 and the final filtered image $I_F(x,y,z,W_i)$ 198 is complete.

With reference back to FIGS. 1 and 2, this three-dimensional filtered image 198 can then be processed by performing 72 minimum or maximum intensity projections (MIPS) 74 which are displayed, e.g. on the display device 48. The filtered image 198 could also undergo further processing, e.g. to separate the arterial or vascular sub-systems (steps not shown). Such additional post-processing is greatly enhanced by the improved vascular contrast provided by the filtering described herein.

The technique has been described with respect to white blood angiographic images in which imaged vascular structures produce a relatively high image signal compared with non-vascular structures. However, those skilled in the art will recognize that the filtering is equally applicable to black blood angiographic images in which imaged vascular structures produce a relatively low image signal compared with non-vascular structures.

Figure 15:
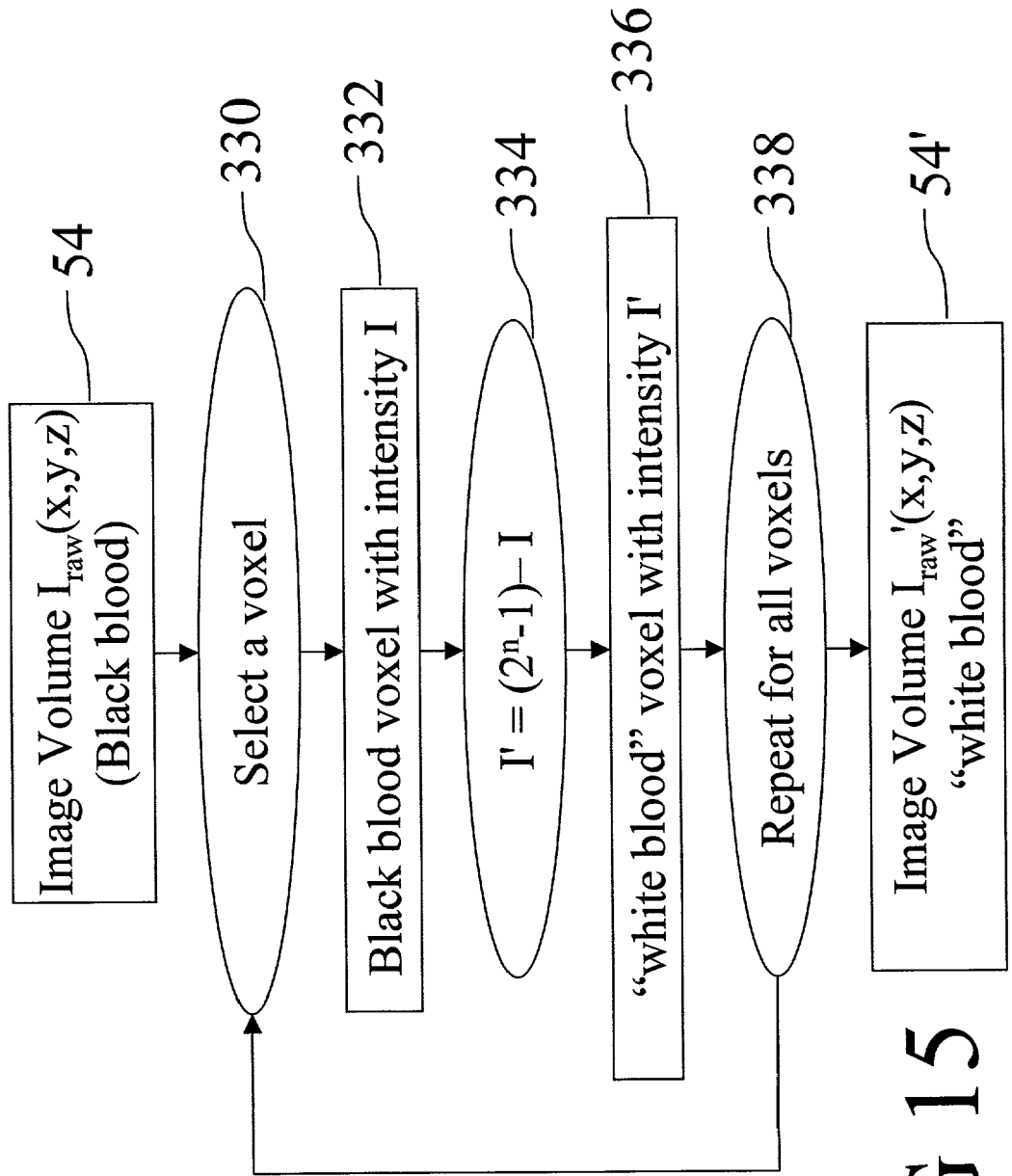
FIG. 15 shows a diagrammatic representation of an inversion transform for converting black blood angiographic data to an intensity polarity corresponding to white blood angiographic data.

With reference to FIG. 15, an exemplary approach is described for applying the filtering to black blood angiographic data. In this approach, a preliminary inversion transformation of a raw black blood image $I_{raw}(x,y,z)$ 54 is performed. A selected 330 pixel 332 is inverted using the transformation 334 $I_{raw}'(x,y,z)=(2^n-1)-I_{raw}(x,y,z)$ where n is the bit resolution of the raw image $I_{raw}(x,y,z)$ 54. For eight bit resolution, $(2^n-1)=(256-1)=255$. The transformation 334 generates an effective "white blood" voxel 336, i.e. a voxel for which high intensity (i.e., white) corresponds to a vascular region and low intensity (i.e., black) corresponds to background. The transformation 334 is repeated 338 for every voxel to generate a new $I_{raw}(x,y,z)$ 54' which has the intensity polarity of white blood angiography. This inversion transformed image $I_{raw}(x,y,z)$ 54' is then used in place of the original $I_{raw}(x,y,z)$ 54 in the filtering process.

Those skilled in the art will recognize that the inversion transformation of FIG. 15 is exemplary only. Other methods are also contemplated for applying the filtering to black blood angiographic data, including directly modifying the filtering process to account for the black blood polarity which is inverted relative to the white blood polarity.

Figure 16A:
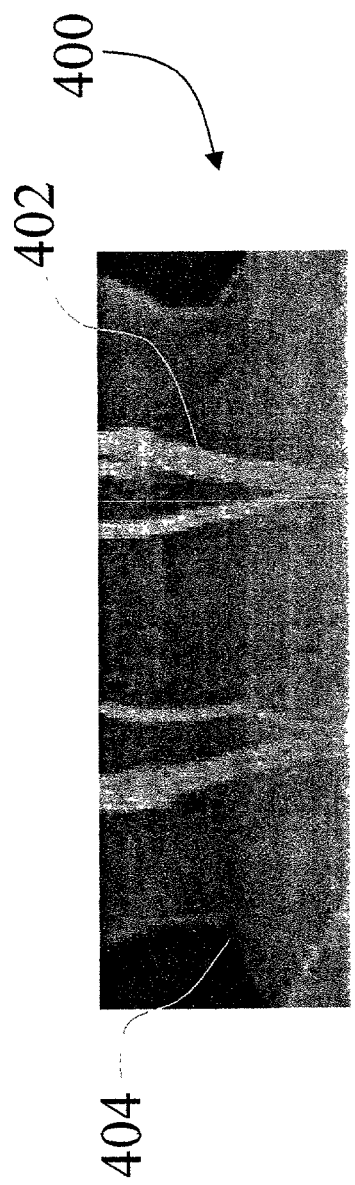
FIG. 16A shows an unfiltered raw MIP image of a carotid region.
Figure 16B:
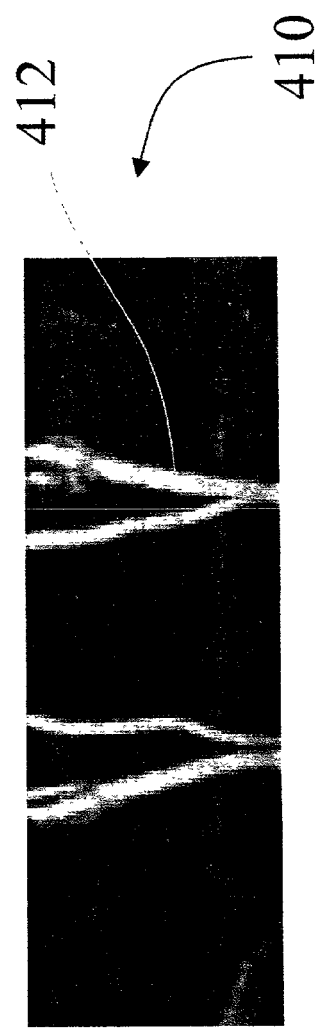
FIG. 16B shows the raw MIP image of FIG. 16A after filtering using an embodiment of the invention.

FIGS. 16A and 16B show an exemplary application of a filtering method in accordance with the invention. FIG. 16A shows a raw maximum intensity projection (MIP) image 400 of a carotid region, without filtering. The image 400 shows carotid vascular features 402 which are somewhat obscured by non-vascular contrast 404 corresponding to the outline of the neck region.

FIG. 16B shows the filtered image 410 corresponding to the unfiltered image 400. The filtered image 410 shows much sharper vascular structures 412 with substantially reduced non-vascular background. The filtered image captures both thick and thin vessels and has a high signal-to-noise ratio (SNR) and contrast-to-noise ratio (CNR) values. The blurriness of the original image is substantially removed by the filtering and the edges are sharpened.

FIGS. 17A and 17B show another exemplary application of a filtering method in accordance with the invention. FIG. 17A shows a raw maximum intensity projection (MIP) image 500 of an abdominal region, without filtering. The image 500 shows vascular features 502, but also includes non-vascular features including kidneys 504 that obscure some of the vascular structure, e.g. the vascular structure 506.

FIG. 17B shows the filtered image 510 corresponding to the unfiltered image 500. The filtered image 510 shows much sharper vascular structures 512 with substantially reduced non-vascular structure intensities 514. In particular, the kidneys are essentially removed from the image. Furthermore, the vascular structures 516 that were obscured in the raw image 500 are more easily distinguishable over the non-vascular features in the filtered image 510.

Although the invention has been described with respect to three-dimensional angiography, it is also applicable to other imaging areas where selective filtering enhancement of structures of particular sizes and or shapes is advantageous. For example, in two-dimensional x-ray mammography, potentially cancerous lesions usually appear as approximately circular structures that are typically 2–8 millimeters in diameter. The present filtering method is applicable for selectively filtering such images to enhance the lesion structures. In applying the filtering to x-ray mammography, the hangness term 286 is preferably turned off in FIG. 13, e.g. by setting the $\epsilon$ tuner 284 to zero, since the lesions are not usually interconnected. Similar adjustments can be made to focus the filtering on other types of images structures so that the method is applicable to a wide range of imaging modalities beyond angiography.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiments, the invention is now claimed to be:

1. A post-acquisition method for producing a filtered gray scale 3D angiographic image representation, the method comprising:

generating a three-dimensional image representation that conforms to a pre-selected format with vascular contrast;

defining a set of blood vessel width parameters $W_i$ that range from a minimum width parameter $W_{min}$ to a maximum width parameter $W_{max}$;

generating a corresponding image $I_i$ that selectively retains vascular structures of width $W_i$ contained in the three-dimensional image representation for each width parameter $W_i$; and combining the images $I_i$ to form a filtered angiographic image representation that selectively retains vascular structures having widths between $W_{min}$ and $W_{max}$.

2. The post-acquisition filtering method as set forth in claim 1, wherein the defining of a set of blood vessel width parameters $W_i$ includes:

defining the minimum width parameter $W_{min}$ based on one of a user input and angiographic data resolution.

3. The post-acquisition filtering method as set forth in claim 1, wherein the defining of a set of blood vessel width parameters $W_i$ includes:

defining the maximum width parameter $W_{max}$ by:

obtaining a planar intensity projection of the angiographic image representation, binarizing the planar intensity projection using a binarization threshold that selectively enhances vascular contrast, and selecting the maximum width $W_{max}$ through analysis of the vascular structures imaged in the binarized planar intensity projection.

4. The post-acquisition filtering method as set forth in claim 3, wherein the binarizing of the planar intensity projection using a binarization threshold that selectively enhances vascular contrast includes:

constructing a normalized pixel intensity histogram of the planar intensity projection;

selecting a threshold index value that partitions the histogram into a lower intensity portion and a higher intensity portion;

constructing a figure of merit based on statistical parameters associated with at least one of the lower intensity portion and the higher intensity portion;

repeating the selecting and constructing for a range of threshold index values; and selecting a binarization threshold as that threshold index value that optimizes the constructed figure of merit.

5. The post-acquisition filtering method as set forth in claim 1, wherein the generating for each width parameter $W_i$ a corresponding image $I_i$ that selectively retains vascular structures of width $W_i$ contained in the angiographic image representation includes:

calculating for each width parameter $W_i$ a vessel score associated with each voxel of the angiographic image representation, said vessel score being indicative of the likelihood that the voxel is included in a blood vessel of width corresponding to $W_i$, voxels of the image $I_i$ having values corresponding to the vessel scores.

6. The post-acquisition filtering method as set forth in claim 5, wherein the calculating for each width parameter $W_i$ of a vessel score associated with each voxel of the angiographic image representation includes:

calculating a Hessian matrix at each voxel wherein the estimation of the partial derivatives comprising the Hessian matrix include a scale factor functionally dependent upon the width parameter $W_i$;

extracting the eigenvalues of the Hessian matrix; and computing a vessel score at each voxel for the width parameter $W_i$ based on the eigenvalues of the Hessian matrix.

7. The post-acquisition filtering method as set forth in claim 6, wherein calculating of a Hessian matrix includes:

estimating partial derivatives of the image data by convolving the image representation with a Gaussian second order derivative kernel whose variance is a function of the width parameter $W_i$, wherein the convolving is performed in linear fashion using separation of the Gaussian kernel.

8. The post-acquisition filtering method as set forth in claim 5, wherein calculating the vessel score includes:

computing a blobbiness term indicative of the fatness of the structure containing the voxel.

9. The post-acquisition filtering method as set forth in claim 5, wherein calculating the vessel score includes:

computing an in-plane or plane/line term indicative of a ratio of the largest area of cross-section to the largest axis of this cross-section of the structure containing the voxel.

10. The post-acquisition filtering method as set forth in claim 5, wherein calculating the vessel score includes:

computing a hangness term indicative of the voxel connectivity or brightness.

11. The post-acquisition filtering method as set forth in claim 5, wherein calculating the vessel score includes:

scaling by a factor $$\exp\left(-\frac{R_B^2}{2\beta^2}\right)$$

with $$R_B^2 = \frac{|\lambda_1|}{\sqrt{|\lambda_2 \cdot \lambda_3|}}$$

where $\lambda_1$ is the eigenvalue along the direction of minimum curvature, $\lambda_2$ and $\lambda_3$ are the remaining eigenvalues, and $\beta$ is a sensitivity factor.

12. The post-acquisition filtering method as set forth in claim 5, wherein calculating the vessel score includes:

scaling by a factor $$\left(1 - \exp\left(-\frac{R_A^2}{2\alpha^2}\right)\right)$$

with $$R_A^2 = \frac{|\lambda_2|}{|\lambda_3|}$$

where $\lambda_1$ is the eigenvalue along the direction of minimum curvature, $\lambda_2$ and $\lambda_3$ are the remaining eigenvalues, and $a$ is a sensitivity factor.

13. The post-acquisition filtering method as set forth in claim 5, wherein calculating the vessel score includes:

scaling by a factor $$\left(1 - \exp\left(-\frac{S^2}{2\varepsilon^2}\right)\right)$$

with $$S = \sqrt{\lambda_1^2 + \lambda_2^2 + \lambda_3^2}$$

where $\lambda_1$ is the eigenvalue along the direction of minimum curvature, $\lambda_2$ and $\lambda_3$ are the remaining eigenvalues, and $\epsilon$ is a sensitivity factor.

14. A post-acquisition method for producing a filtered gray scale 3D angiographic image representation, the method comprising:

generating a three-dimensional image representation that conforms to a pre-selected format with vascular contrast;

defining a set of blood vessel width parameters $W_i$ that range from a minimum width parameter $W_{min}$ to a maximum width parameter $W_{max}$;

generating a corresponding image $I_i$ that selectively retains vascular structures of width $W_i$ contained in the three-dimensional image representation for each width parameter $W_i$; and combining the images $I_i$ to form a filtered angiographic image representation by selecting a filtered voxel value for each filtered voxel corresponding to the highest vessel score obtained for that voxel among the images $I_i$.

15. The post-acquisition filtering method as set forth in claim 1, wherein the defining of the set of blood vessel width parameters $W_i$ includes defining the maximum width parameter $W_{max}$ by:
projecting a MIP comprising one of a maximum intensity projection and a minimum intensity projection from the angiographic image data;
binarizing the MIP to generate a binary image representation using a binarization threshold that enhances vascular contrast;
identifying the largest blood vessel structure in the binary image representation; and
estimating $W_{max}$ as the diameter of the largest blood vessel.

16. The post-acquisition filtering method as set forth in claim 15, wherein the binarizing comprises:
calculating a pixel intensity histogram;
selecting a threshold index value that divides the histogram into two partitions;
statistically analyzing the histogram to generate a statistical figure of merit corresponding to the threshold index value;
repeating the selecting and the statistical analyzing for a plurality of threshold index values; and
identifying the binarization threshold as the threshold index value having one of a largest figure of merit and a smallest figure of merit.

17. An apparatus for producing a filtered gray scale three-dimensional angiographic image representation of a subject, the apparatus comprising:
an imaging scanner that acquires imaging data from at least a portion of a patient;
a reconstruction processor that reconstructs a three-dimensional image representation from the imaging data, wherein the image representation includes vascular contrast effectuated by at least one of an associated contrast agent administered to the patient and an operative imaging modality of the imaging scanner that selectively images vascular structure; and
a post-acquisition processor that:
transforms the image representation into a pre-processed image representation that conforms to a pre-selected image format,
generates a plurality of images $I_i(x,y,z)$ each of which selectively retains vascular structures of width $W_i$ contained in the pre-processed image, where the widths $W_i$ span a range from a minimum $W_{min}$ to a maximum $W_{max}$ inclusive, and
combines the images $I_i(x,y,z)$ to form a filtered angiographic image representation that selectively retains vascular structures having widths between $W_{min}$ and $W_{max}$ inclusive.

18. The apparatus as set forth in claim 17, wherein the transforming of the image representation into a pre-processed image includes at least one of:
convolutionally smoothing the image representation;
down-sampling the image by a pre-selected fraction; and
converting non-isotropic voxels into isotropic voxels.

19. The apparatus as set forth in claim 17, wherein:
the imaging scanner acquires white blood imaging data.

20. The apparatus as set forth in claim 17, wherein:
the imaging scanner acquires black blood imaging data; and
the transforming of the image representation into a pre-processed image includes inversion transforming the image intensities of the acquired black blood imaging data.

21. The post-acquisition filtering method as set forth in claim 1, wherein the generating for each width parameter $W_i$ a corresponding image $I_i$ includes:
analyzing the angiographic image representation to identify tubular structures with a pre-selected cross-section in a size range indicated by $W_i$ and creating the corresponding image $I_i$ of the identified structures in the size range indicated by $W_i$.

22. The post-acquisition filtering method as set forth in claim 21, wherein the selected cross-sections are one of circular and oval.

23. The post-acquisition filtering method as set forth in claim 1, wherein the defining of a set of blood vessel width parameters $W_i$ includes selecting the maximum width parameter $W_{max}$ by:
projecting the angiographic image representation onto a plane to create a projection comprised of pixels;
binarizing the projection to generate a binary image representation using a binarization threshold that substantially separates pixels representing vascular regions from other pixels; and
identifying $W_{max}$ as the size of the largest vascular region contained in the binary image representation.

24. The post-acquisition filtering method as set forth in claim 23, wherein the binarizing of the projection to generate a binary image representation using a binarization threshold that optimally separates pixels representing vascular regions from other pixels includes:
obtaining a histogram of the pixel intensities; and
statistically analyzing the histogram to select a binarization threshold that optimally separates a high intensity histogram peak corresponding to pixels of the vascular regions from the remaining pixels.

25. The post-acquisition filtering method as set forth in claim 23, wherein the identifying of $W_{max}$ as the size of the largest vascular region contained in the binary image representation includes:
identifying center lines of the vascular regions;
identifying edge lines of the vascular regions; and
defining half-widths corresponding to distances between the center lines and the edge lines.

26. The post-acquisition filtering method as set forth in claim 25, wherein the identifying of center lines of the vascular regions includes:
decomposing the center lines search into four component passes, including:
a first pass from left to right and top to bottom,
a second pass from top to bottom and from left to right,
a third pass from bottom to top and from left to right, and
a fourth pass from bottom to top and from right to left.

* * * * *